(12) United States Patent
Liu et al.

(10) Patent No.: US 12,310,252 B2
(45) Date of Patent: May 20, 2025

(54) SEMICONDUCTOR MEMORY STRUCTURE AND METHOD FOR FORMING THE SEMICONDUCTOR MEMORY STRUCTURE

(71) Applicant: Taiwan Semiconductor Manufacturing Company, Ltd., Hsinchu (TW)

(72) Inventors: Tzu-Ting Liu, Taoyuan (TW); Yu-Jen Wang, Hsinchu (TW); Chih-Pin Chiu, Hsinchu (TW); Hung-Chao Kao, Taipei (TW); Chih-Chuan Su, Hsinchu (TW); Liang-Wei Wang, Hsinchu (TW); Chen-Chiu Huang, Taichung (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 487 days.

(21) Appl. No.: 17/690,613

(22) Filed: Mar. 9, 2022

(65) Prior Publication Data

US 2023/0292629 A1 Sep. 14, 2023

(51) Int. Cl.
*H10N 50/80* (2023.01)
*H10B 61/00* (2023.01)
*H10N 50/01* (2023.01)

(52) U.S. Cl.
CPC ............ *H10N 50/80* (2023.02); *H10B 61/00* (2023.02); *H10N 50/01* (2023.02)

(58) Field of Classification Search
CPC ........ H10N 50/80; H10N 50/01; H10N 50/10; H10B 61/00
See application file for complete search history.

(56) References Cited

U.S. PATENT DOCUMENTS

| | | | |
|---|---|---|---|
| 2010/0102407 A1* | 4/2010 | Kajiyama | H10B 61/22 257/E29.323 |
| 2010/0193784 A1* | 8/2010 | Morosawa | H01L 29/7869 257/E29.296 |
| 2017/0125663 A1* | 5/2017 | Nagel | G11C 11/161 |
| 2022/0209104 A1* | 6/2022 | Aggarwal | H10N 52/80 |

* cited by examiner

*Primary Examiner* — Shih Tsun A Chou
(74) *Attorney, Agent, or Firm* — McClure, Qualey & Rodack, LLP

(57) ABSTRACT

A method for forming a semiconductor memory structure includes forming an MTJ stack over a substrate. The method also includes etching the MTJ stack to form an MTJ device. The method also includes depositing a metal layer over a top surface and sidewalls of the MTJ device. The method also includes oxidizing the metal layer to form an oxidized metal layer. The method also includes depositing a cap layer over the oxidized metal layer. The method also includes oxidizing the cap layer to form an oxidized cap layer. The method also includes removing an un-oxidized portion of the cap layer.

20 Claims, 23 Drawing Sheets

SEMICONDUCTOR MEMORY STRUCTURE AND METHOD FOR FORMING THE SEMICONDUCTOR MEMORY STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
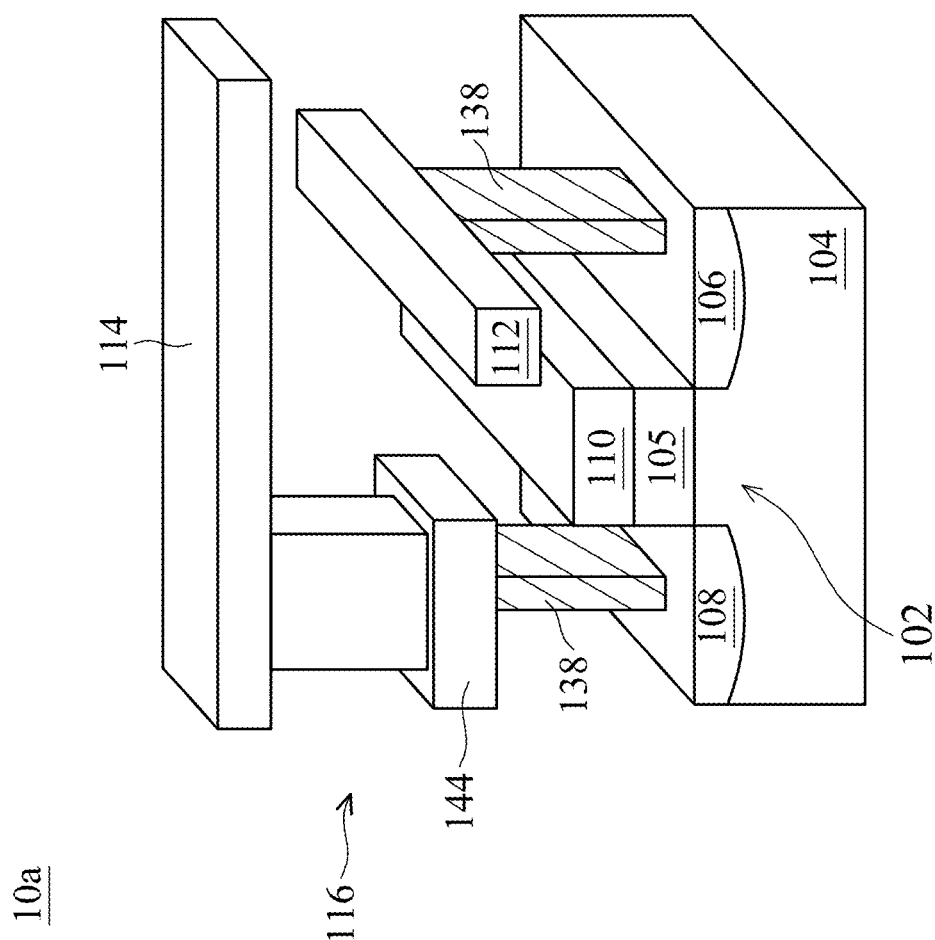
FIG. 1 is a perspective representation of a semiconductor memory structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments for forming a semiconductor memory structure are provided. The method for forming the semiconductor memory structure may include forming a metal cap layer over the magnetic tunneling junction (MTJ) device of a magnetoresistive random-access memory (MRAM) cell. The metal cap layer may react with excess oxygen residue over the sidewalls of the MTJ device to form a metal oxide cap layer with ceramic insulation properties. After desorbing the un-oxidized portion of the metal cap layer, a metal oxide layer remains over sidewalls of the MTJ device. The metal oxide layer may not affect MTJ performance and provide isolation to prevent leakage current.

FIG. 1 is a perspective representation of a semiconductor memory structure 10a, in accordance with some embodiments of the disclosure. A device 102 may be formed over a substrate 104. The device 102 including a gate structure 105, a source region 106, and a drain region 108. The gate structure 105 may be electrically coupled to a word line (WL) 110. The source region 106 may be electrically coupled to a source line (SL) 112, and the drain region 108 may be electrically coupled to bit line (BL) 114. A magnetic tunneling junction (MTJ) stack 116 may be formed between the drain region 108 and the BL 114. The MTJ stack 116 may include an insulating layer sandwiched between a bottom ferromagnetic plate and an upper ferromagnetic plate. The bottom ferromagnetic plate may be a pinned antiferromagnetic layer, and the upper ferromagnetic plate may be a free magnetic layer with more than two magnetic field values. Therefore, two or more data states may be stored in the MTJ stack 116. It should be noted that, the insulating layer, the bottom ferromagnetic plate, and the upper ferromagnetic plate of the MTJ stack 116 may be multilayer structures.

The MTJ stack 116 may use tunnel magnetoresistance (TMR) to store the magnetic fields on the upper ferromagnetic plates and the lower ferromagnetic plates. Electrons may tunnel from the upper ferromagnetic plates to the lower ferromagnetic plates. The current may induce a magnetic field in the upper ferromagnetic plates. The MTJ stack 116 may also use spin-transfer-torque (STT) to store magnetic fields on the upper ferromagnetic plates and the lower ferromagnetic plates. A spin-aligned or polarized electron flow is used to change the magnetic field within the upper ferromagnetic plates. Data writing method involves in changing the magnetic field within the upper ferromagnetic plates.

The electrical resistance of the MTJ stack 116 changes as the magnetic fields stored in the upper and lower ferromagnetic plates changes, due to the magnetic tunnel effect. For example, when the magnetic fields of the upper and lower ferromagnetic plates are aligned in the same direction, the MTJ stack 116 is in a low-resistance state. When the magnetic fields of the upper and lower ferromagnetic plates are in opposite directions, the MTJ stack 116 is in a high-resistance state. The direction of the magnetic field of the upper ferromagnetic plate can be changed by passing a current through the MTJ stack 116. By measuring the electrical resistance between the upper and lower ferromagnetic plates, a read circuitry coupled to the MTJ stack 116 can discern between the low-resistance state and the high-resistance state.

Figure 2:
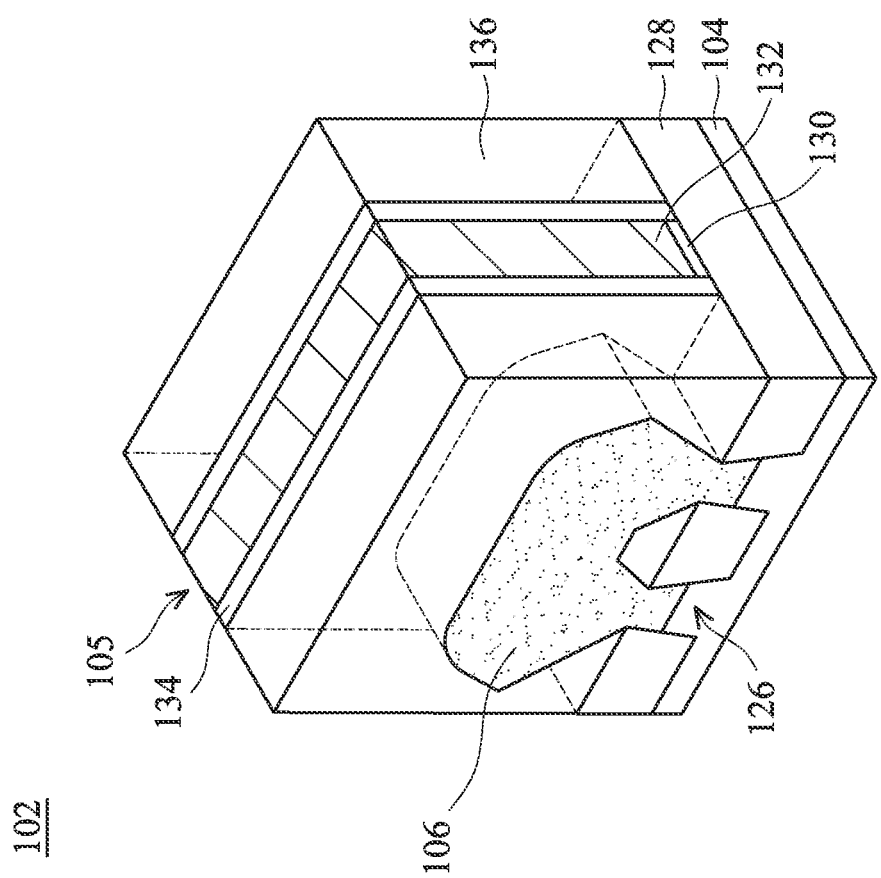
FIG. 2 is a perspective representation of a semiconductor memory structure, in accordance with some embodiments of the disclosure.

The transistor 102 may be a FinFET device, as shown in FIG. 2 in accordance with some embodiments. The transistor 102 may also be planar transistors, gate-all-around (GAA) transistors, or other non-planar transistors. The transistor 102 shown in FIG. 2 may be an exemplary device formed under the MTJ stack 116 shown in FIG. 1.

FIGS. 3A-3I are cross-sectional representations of various stages of forming a semiconductor memory structure 10a, in accordance with some embodiments of the disclosure. A substrate 104 is provided as shown in FIGS. 1-3 in accordance with some embodiments. The substrate 104 may be a semiconductor wafer such as a silicon wafer. The substrate 104 may also include other elementary semiconductor materials, compound semiconductor materials, and/or alloy semiconductor materials. Examples of elementary semiconductor materials may include, but are not limited to, crystal silicon, polycrystalline silicon, amorphous silicon, germanium, and diamonds. Examples of compound semiconductor materials include, but are not limited to, silicon carbide, gallium nitride, gallium arsenic, gallium phosphide, indium phosphide, indium arsenide, and indium antimonide. Examples of alloy semiconductor materials may include, but are not limited to, SiGe, GaAsP, AlInAs, AlGaAs, GaInAs, GaInP, and GaInAsP. The substrate 104 may include an epitaxial layer. For example, the substrate 104 may be an epitaxial layer overlying a bulk semiconductor. In addition, the substrate 104 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 104 may be an N-type substrate. The substrate 104 may be a P-type substrate.

Next, a pad layer may be blanketly formed over the substrate 104, and a hard mask layer may be blanketly formed over the pad layer (not shown). The pad layer may be a buffer layer between the substrate 104 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, or another applicable process.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 104 to form a fin structure 126 by using the hard mask layer as a mask as shown in FIG. 2 in accordance with some embodiments. The etching process may be a dry etching process or a wet etching process. In some embodiments, the substrate 104 is etched by a dry etching process. The etching process may be a time-controlled process, and continue until the fin structure 126 reaches a predetermined height. It should be noted that since the fin structure 126 and the substrate 104 are made of the same material, and there is no obvious interface between them.

Next, a liner layer may be conformally formed on the sidewalls and the top surface of the fin structure 126 (not shown). The liner layer may be used to protect the fin structure 126 from being damaged in the following processes (such as an anneal process or an etching process). The liner layer may be made of silicon nitride.

Next, an isolation layer 128 is formed to cover the fin structure 126 and the substrate 104 as shown in FIG. 2 in accordance with some embodiments. The isolation layer 128 may be made of silicon oxide, silicon nitride, silicon oxynitride, fluoride-doped silicate glass (FSG), or another low-k dielectric material. The isolation layer 128 may be deposited by a deposition process, such as a chemical vapor deposition (CVD) process, a spin-on-glass process, or another applicable process.

Afterwards, the isolation layer 128 may be planarized to expose the top surface of the patterned hard mask layer (not shown). The isolation layer 128 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 128, as shown in FIG. 2 in accordance with some embodiments. The etching process may be used to remove a portion of the liner layer and a portion of the isolation layer 128. As a result, the top portion of the fin structure 126 may be exposed and the remaining isolation layer 128 may surround the base portion of the fin structure 126. The remaining isolation layer 128 may be an isolation structure 128 such as a shallow trench isolation (STI) structure surrounding the base portion of the fin structure 126. The isolation structure 128 may be configured to prevent electrical interference or crosstalk.

Next, a dummy gate structure is formed over and across the fin structure 126 (not shown). The dummy gate structure may include a dummy gate dielectric layer and a dummy gate electrode layer. The dummy gate dielectric layer and the dummy gate electrode layer may be replaced by the following steps to form a real gate structure with a high-k dielectric layer and a metal gate electrode layer.

The dummy gate dielectric layer may include silicon oxide. The silicon oxide may be formed by an oxidation process (e.g., a dry oxidation process, or a wet oxidation process), a chemical vapor deposition process, other applicable processes, or a combination thereof. Alternatively, the dummy gate dielectric layer may include a high-k dielectric layer (e.g., the dielectric constant is greater than 3.9) such as hafnium oxide ($HfO_2$). Alternatively, the high-k dielectric layer may include other high-k dielectrics, such as LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, $(Ba, Sr)TiO_3$, $Al_2O_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The dummy gate electrode layer may include polycrystalline-silicon (poly-Si), poly-crystalline silicon-germanium (poly-SiGe), other applicable materials, or a combination thereof. The dummy gate electrode layer may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the dummy gate dielectric layer and the dummy gate electrode layer to form the dummy gate structure by using a patterned photoresist layer as a mask (not shown). The etching process may be a dry etching process or a wet etching process. The dummy gate dielectric layer and a dummy gate electrode layer may be etched by a dry etching process. After the etching process, the top portion of the fin structure 126 may be exposed on opposite sides of the dummy gate structure.

Next, a pair of spacers 134 is formed on opposite sidewalls of the dummy gate structure, as shown in FIG. 2 in accordance with some embodiments. The spacers 134 may be made of silicon oxide, silicon nitride, silicon oxynitride, and/or dielectric materials. The spacers 134 may be formed by a chemical vapor deposition (CVD) process, a spin-on-glass process, or another applicable process.

Afterwards, the top portion of the fin structure 126 exposed on opposite sides of the dummy gate structure may be removed in an etching process to form a recess (not shown). The etching process may be a dry etching process or a wet etching process. The fin structures 126 may be etched by a dry etching process.

Next, a source epitaxial structure 106 and a drain epitaxial structure 108 are formed in the recess over the fin structure 126 on opposite sides of the dummy gate structure, as shown in FIGS. 1 and 2 in accordance with some embodiments. A strained material may be grown in the recess by an epitaxial (epi) process to form the source epitaxial structure 106 and the drain epitaxial structure 108. In addition, the lattice constant of the strained material may be different from the lattice constant of the substrate 104. The source epitaxial structure 106 and the drain epitaxial structure 108 may include Ge, SiGe, InAs, InGaAs, InSb, GaAs, GaSb, InAlP, InP, SiC, SiP, other applicable materials, or a combination thereof. The source epitaxial structure 106 and the drain epitaxial structure 108 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), or any other suitable method.

Figure 3A:
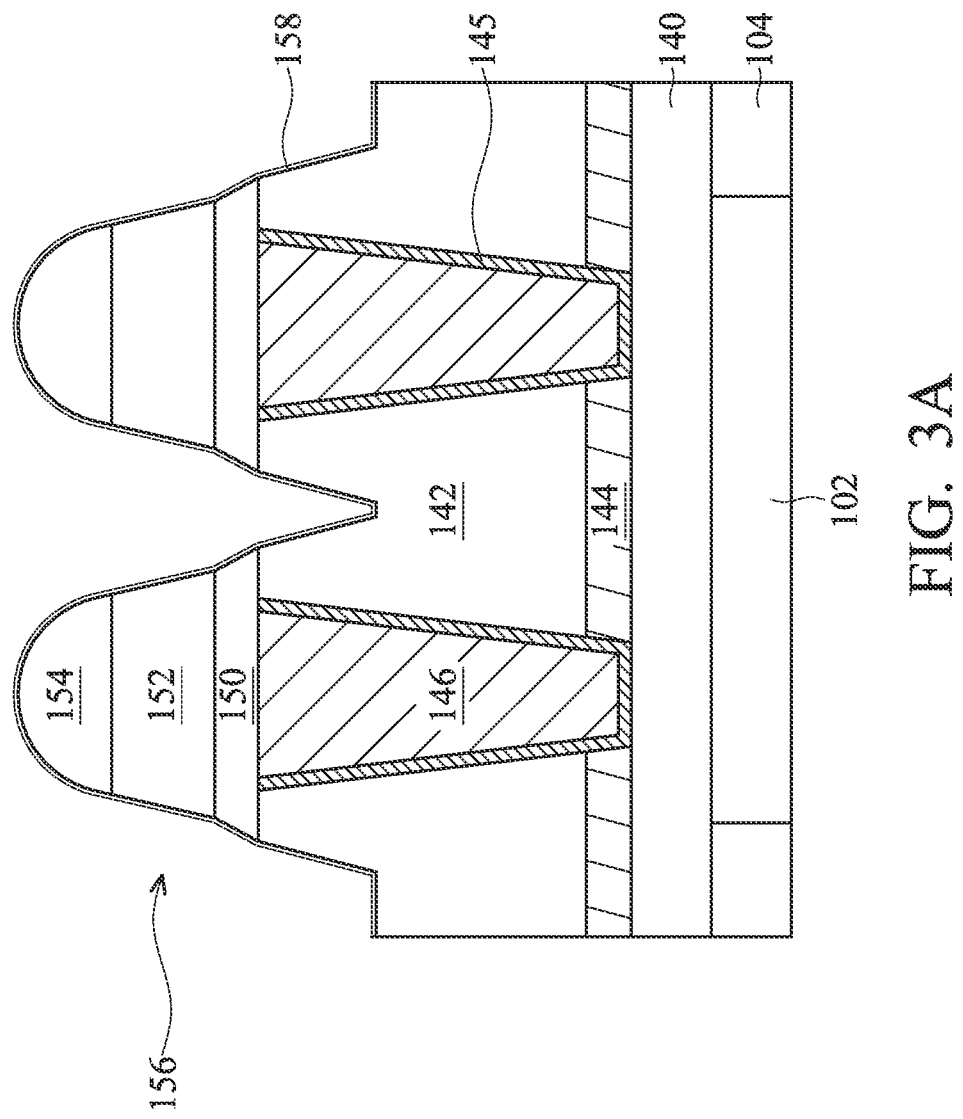
FIGS. 3A-3I are cross-sectional representations of various stages of forming a semiconductor memory structure, in accordance with some embodiments of the disclosure.

After the source epitaxial structure 106 and the drain epitaxial structure 108 are formed, a first inter-layer dielectric (ILD) structure 136 is formed to cover the source epitaxial structure 106 and the drain epitaxial structure 108, as shown in FIGS. 2 and 3A in accordance with some embodiments. The first ILD structure 136 may surround the fin structure 126, the source epitaxial structure 106, and the drain epitaxial structure 108.

The first ILD structure 136 may include multilayers made of multiple dielectric materials, such as silicon oxide ($SiO_x$, where x may be a positive integer), silicon oxycarbide ($SiCO_y$, where y may be a positive integer), silicon oxycarbonitride ($SiNCO_z$, where z may be a positive integer), silicon nitride, silicon oxynitride, un-doped silicate glass (USG), phosphosilicate glass (PSG), borophosphosilicate glass (BPSG), low-k dielectric material, or other applicable dielectric materials. Examples of low-k dielectric materials include, but are not limited to, fluoride-doped silicate glass (FSG), carbon doped silicon oxide, amorphous fluorinated carbon, parylene, bis-benzocyclobutenes (BCB), and polyimide. The first ILD structure 136 may be formed by chemical vapor deposition (CVD), spin-on coating, or other applicable processes.

Afterwards, a planarizing process is performed on the first ILD structure 136 until the top surface of the dummy gate structure is exposed, as shown in FIG. 2 in accordance with some embodiments. After the planarizing process, the top surface of the dummy gate structure may be substantially level with the top surfaces of the spacers 134 and the first ILD structure 136. The planarizing process may include a grinding process, a chemical mechanical polishing (CMP) process, an etching process, other applicable processes, or a combination thereof.

Next, the dummy gate structure including the dummy gate dielectric layer and the dummy gate electrode layer is removed to form a trench between the spacers 134 (not shown). The fin structure 126 may be exposed form the trench. The dummy gate dielectric layer and the dummy gate electrode layer may be removed by an etching process, such as a dry etching process or a wet etching process.

Next, an interfacial layer 130 is formed across the fin structure 126, as shown in FIG. 2 in accordance with some embodiments. The interfacial layer 130 may be made of silicon oxide. The silicon oxide may be formed by an oxidation process (such as a dry oxidation process, or a wet oxidation process), deposition process (such as a chemical vapor deposition (CVD) process or an atomic layer deposition (ALD) process), other applicable processes, or a combination thereof. The interfacial layer 130 may be thermally grown using a thermal oxidation process in oxygen-containing ambient or nitrogen-containing ambient (e.g. NO or $N_2O$).

Next, a gate electrode layer 132 is formed over the interfacial layer 130, and a gate structure 105 is formed as shown in FIGS. 1-2 in accordance with some embodiments. The gate electrode layer 132 may include polycrystalline-silicon (poly-Si), poly-crystalline silicon-germanium (poly-SiGe), other applicable materials, or a combination thereof. The gate electrode layer 132 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof. Afterwards, a chemical mechanical polishing (CMP) process or an etching back process may be optionally performing to remove excess gate electrode layer materials.

Afterwards, a patterning and an etching process are performed to form an opening in the first ILD structure 136 by using a patterned photoresist layer as a mask (not shown). A portion of the source epitaxial structure 106 and the drain epitaxial structure 108 may be exposed from the opening. The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process.

Next, a metal semiconductor compound layer may be formed over the source epitaxial structure 106 and the drain epitaxial structure 108 (now shown). The metal semiconductor compound layer may reduce the contact resistance between the source epitaxial structure 106, the drain epitaxial structure 108 and the subsequently formed contact structure over the source epitaxial structure 106 and the drain epitaxial structure 108. The metal semiconductor compound layer may be made of titanium silicide ($TiSi_2$), nickel silicide (NiSi), cobalt silicide (CoSi), or other suitable low-resistance materials. The metal semiconductor compound layer may be formed over the source epitaxial structure 106 and the drain epitaxial structure 108 by forming a metal layer over the source epitaxial structure 106 and the drain epitaxial structure 108 first. The metal layer may react with the source epitaxial structure 106 and the drain epitaxial structure 108 in an annealing process and a metal semiconductor compound layer may be produced. Afterwards, the unreacted metal layer may be removed in an etching process and the metal semiconductor compound layer may be left.

Afterwards, a contact structure 138 is formed into the opening over the source epitaxial structure 106 and the drain epitaxial structure 108, as shown in FIG. 1 in accordance with some embodiments. The contact structure 138 may be made of metal materials (e.g., Co, Ni, W, Ti, Ta, Cu, Al, Ru, Mo, TiN, TaN, and/or a combination thereof), metal alloys, poly-Si, other applicable conductive materials, or a combination thereof. The contact structure 138 may be formed using a chemical vapor deposition process (CVD), a physical vapor deposition process (PVD), (e.g., evaporation or sputter), an atomic layer deposition process (ALD), an electroplating process, another suitable process, or a combination thereof to deposit the conductive materials of the contact structure 138, and then a planarization process such as a chemical mechanical polishing (CMP) process or an etch back process is optionally performed to remove excess conductive materials. After the planarization process, the top surface of the contact structure 138 may be level with the top surface of the first ILD structure 136.

Next, an interconnect structure 140 is formed over the first ILD structure 136 and the contact structure 138, as shown in FIGS. 1, 2, and 3A in accordance with some embodiments. The interconnect structure 140 may include multiple metal layers formed in inter-metal dielectric (IMD) structures. In some embodiments, the metal layer 144 is formed over the interconnect structure 140 over the device 102 shown in FIG. 2.

A dielectric layer 142 is formed in the interconnect structure 140, as shown in FIG. 3A in accordance with some embodiments. The dielectric layer 142 may include an oxide such as silicon dioxide, a low-k dielectric material such as carbon doped oxides, or an extreme low-k dielectric material such as porous carbon doped silicon dioxide, un-doped silicate glass (USG), phosphosilicate glass (PSG), borophosphosilicate glass (BPSG), low-k dielectric material, or other applicable dielectric materials. The dielectric layer 142 may be deposited by a high aspect ratio process (HARP) and/or CVD process such as high density plasma (HDP) CVD, atmospheric pressure CVD (APCVD), low-pressure CVD (LPCVD), or plasma-enhanced CVD (PECVD) process.

Next, the dielectric layer 142 is patterned and etched, and a metal layer 144 is formed in the dielectric layer 142, as shown in FIG. 3A in accordance with some embodiments. The metal layer 144 may include Cu, W, Ag, Ag, Sn, Ni, Co, Cr, Ti, Pb, Au, Bi, Sb, Zn, Zr, Mg, In, Te, Ga, other applicable metallic materials, an alloy thereof, or a combination thereof. The metal layer 144 may include a stacked structure of TiN/AlCu/TiN. The metal layer material 144 may be formed in the opening of the IMD structure, as shown in FIGS. 1 and 3 in accordance with some embodiments. After the metal layer material 144 is deposited, a planarization process (e.g., a chemical mechanical polishing process or an etching back process) may optionally be performed to remove excess metal layer material 144.

Next, a bottom electrode via (BEVA) 146 may be formed through the dielectric layer 142 and over the metal layer 144, as shown in FIG. 3A in accordance with some embodiments. A barrier layer 145 may be formed over the sidewalls and the bottom surface of the BEVA 146. The BEVA 146 and the barrier layer 145 may shield external magnetic fields. The barrier layer 145 may be in contact with the metal layer 144, and the BEVA 146 is electrically connected to the device 102. The barrier layer 145 is sandwiched between the BEVA 146 and the metal layer 144, and is also between the BEVA 146 and the dielectric layer 142 surrounding the bottom electrode via 146. The BEVA 146 may include tungsten, titanium, tantalum, tungsten nitride, titanium nitride, tantalum nitride, other suitable materials, or a combination thereof. The barrier layer may be formed of titanium nitride, tantalum nitride, other suitable materials, or a combination thereof.

Next, a bottom electrode layer 150 is blanketly deposited over the BEVA 146 and dielectric layer 142. The bottom electrode layer 150 may include TiN, TaN, WN, Ru, Ti, Ta, W, Mo, Re, Nb, other applicable materials, an alloy thereof, or a combination thereof. The bottom electrode layer 150 may be formed by a chemical vapor deposition process (CVD), a physical vapor deposition process (PVD), (e.g., evaporation or sputter), an atomic layer deposition process (ALD), an electroplating process, another suitable process, or a combination thereof.

Next, an MTJ stack material 152 may be blanketly formed over the bottom electrode layer 150. The MTJ stack material 152 may include a stack of ferromagnetic layers, MTJ spacers, and a capping layer. The ferromagnetic layer may function as a free layer whose magnetic polarity or magnetic orientation can be changed during write operation of the MRAM cell. The ferromagnetic layers and the MTJ spacer may function as a fixed or pinned layer whose magnetic orientation may not be changed during operation of the MRAM cell. The MTJ stack material 152 may also include an antiferromagnetic layer. The ferromagnetic layers may include multiple layers.

The capping layer may be formed over the ferromagnetic layer. Each of the ferromagnetic layers may include ferromagnetic material, which may be metal or metal alloy. For example, the ferromagnetic layers may include Fe, Co, Ni, CoFeB, FeB, CoFe, FePt, FePd, CoPt, CoPd, CoNi, TbFeCo, CrNi, or the like. The MTJ spacer may include non-ferromagnetic metal such as Ag, Au, Cu, Ta, W, Mn, Pt, Pd, V, Cr, Nb, Mo, Tc, Ru or the like. The MTJ spacer may also include insulator such as $Al_2O_3$, MgO, TaO, RuO or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, $Al_2O_3$, MgO, TaO, RuO or the like. The capping layer may reduce write current of its associated MRAM cell.

Next, a top electrode layer 154 may be blanketly formed over the MTJ stack material 152. The processes and materials for forming the top electrode layer 154 may be the same as, or similar to, those used to form the bottom electrode layer 150. For the purpose of brevity, the descriptions of these processes and materials are not repeated herein.

Next, the bottom electrode layer 150, the MTJ stack material 152, and the top electrode layer 154 are patterned and etched to form individual MRAM cells 156, as shown in FIG. 3A in accordance with some embodiments. The patterning process may include a photolithography process and an etching process. Examples of photolithography processes include photoresist coating, soft baking, mask aligning, exposure, post-exposure baking, developing the photoresist, rinsing and drying. The etching process may be a dry etching process or a wet etching process. In some embodiments, the etching process includes ion beam etching (IBE).

The IBE etching may cause a metal layer 158 redepositing over the MRAM cells 156, as shown in FIG. 3A in accordance with some embodiments. In some embodiments, the metal layer 158 is conformally deposited over the sidewalls and the top surface of the MRAM cells 156. The metal layer 158 may include Fe, Co, other metal elements in the MTJ device 156, or a combination thereof.

Figure 3B:
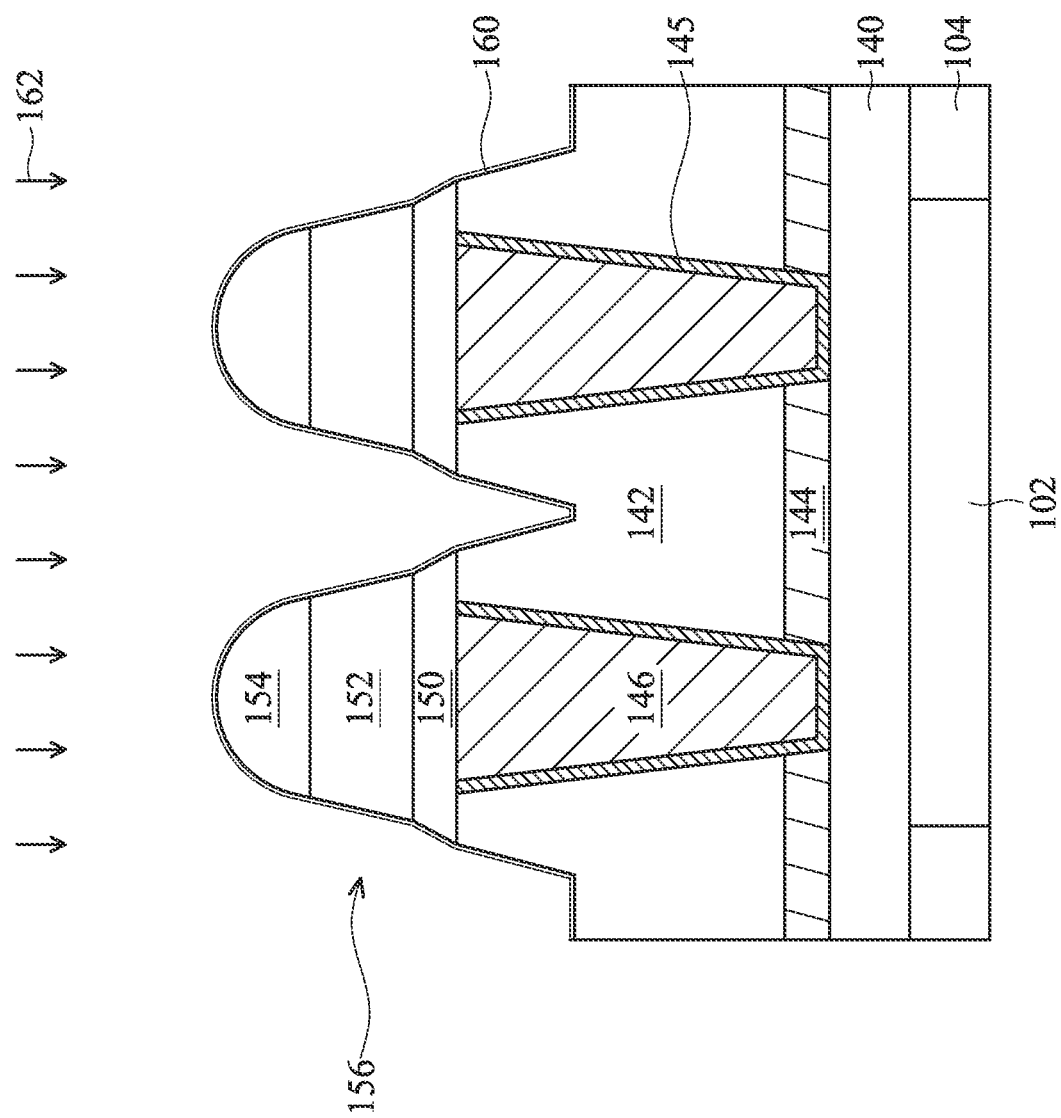

Next, an oxidation process 162 is performed, and the metal layer 158 is oxidized to form an oxidized metal layer 160, as shown in FIG. 3B in accordance with some embodiments. The oxidized metal layer 160 may help to prevent sidewall leakage from the metal layer 158. In some embodiments, the oxidized metal layer 160 is formed over sidewalls of the MTJ device 156. The oxidation process 162 may use oxidant including oxygen. The oxidation process 162 may include using pure oxygen molecules, $O_2$ radical, $O_2$ plasma, $O_2$ implantation, $O_3$, or a combination thereof. After the oxidation process 162, excess oxygen may be produced. The excess oxygen may cover a portion of the sidewalls of the MTJ device 156.

Figure 3C:
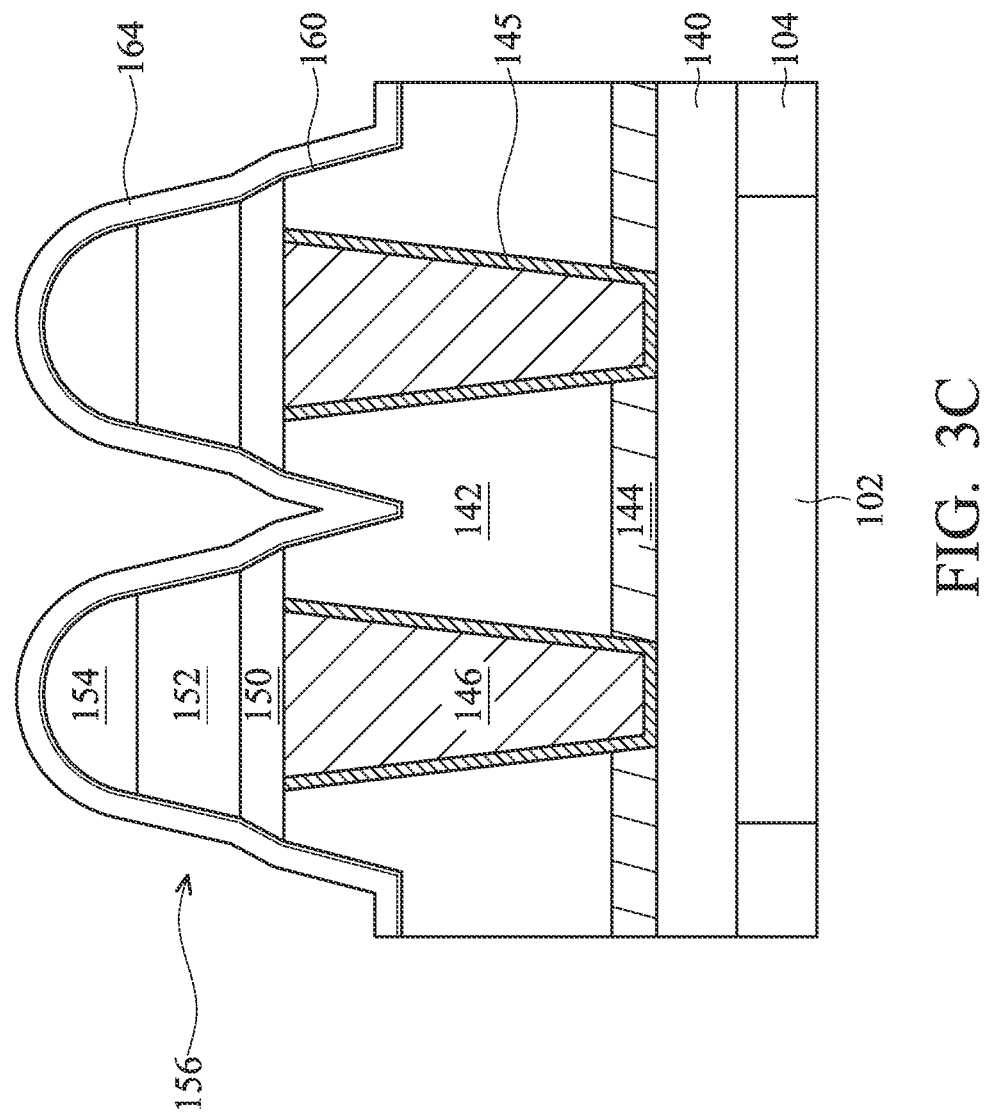

Next, a cap layer 164 is conformally formed over the oxidized metal layer 160, as shown in FIG. 3C in accordance with some embodiments. The cap layer 164 may include more active metal material. After reacting with excess oxygen in the oxidation process 162, the cap layer 164 may include ceramic material which has electrically insulation properties. In some embodiments, the cap layer 164 includes Mg. The cap layer 164 may be formed by a PVD process (e.g., a vacuum evaporation process, or a sputtering process), a chemical vapor deposition process (e.g., a PECVD process, or a MOCVD process), an ALD process (e.g., a PEALD process), other applicable processes, or a combination thereof. The cap layer 164 may be in-situ deposited when etching the MTJ stack 156. In some embodiments, the cap layer 164 is formed by an IBE in-situ PVD process.

In some embodiments, the cap layer 164 has a thickness in a range of 1 nm to 5 nm. If the cap layer 164 is too thick, the duration to degas the metal in the cap layer 164 may be longer, and the thermal budget may be limited. Therefore, the sidewalls of the MTJ stack 152 may become damaged, and the performance may suffer. If the cap layer 164 is too thin, there may not be enough of the element to react with the excess oxygen in the oxidation process 162, and the excess oxygen in the oxidation process 162 may diffuse to the MTJ stack 152 in the following thermal process. The sidewalls of the MTJ stack 152 may become damaged, and the performance may suffer.

Figure 3D:
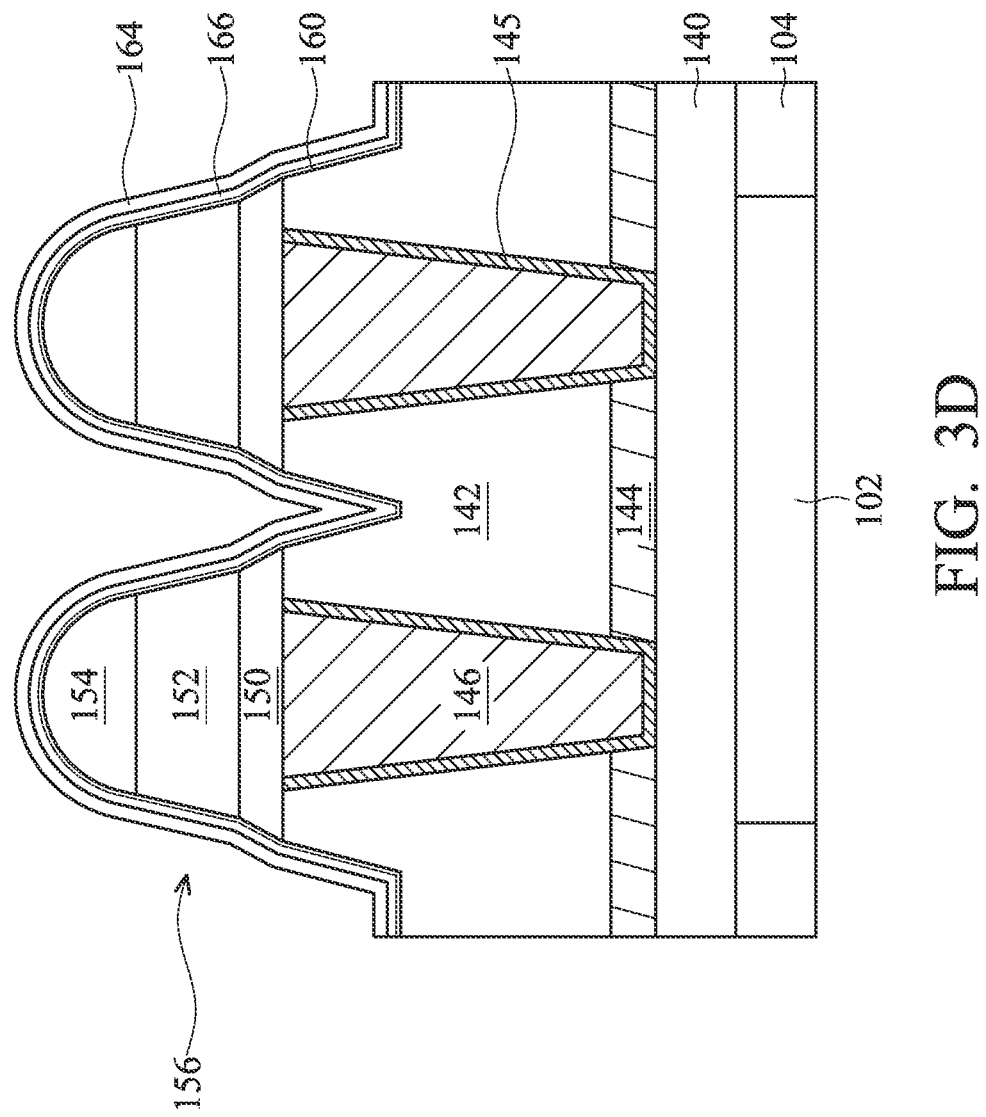

The metal element in the cap layer 164 reacts with the excess oxygen in the oxidation process 162, and an oxidized cap layer 166 is formed over the oxidized metal layer 160, as shown in FIG. 3D in accordance with some embodiments. In some embodiments, the oxidized cap layer 166 includes MgO. For example, Mg in the Mg cap layer 164 may react with the excess oxygen to form MgO cap layer. The oxidized cap layer 166 may be formed by absorbing the oxygen in the oxidation process 162. The oxidized cap layer 166 may have ceramic insulation properties. In some embodiments, the cap layer 164 near the oxidized metal layer 160 is oxidized to form the oxidized cap layer 166, and the cap layer 164 located further away from the oxidized metal layer 160 is not oxidized. The metal element of the cap layer 164 should be able to be degassed in the vacuum chamber. In some embodiments, the oxidized cap layer 166 is conformally formed over the oxidized metal layer 160.

Figure 3E:
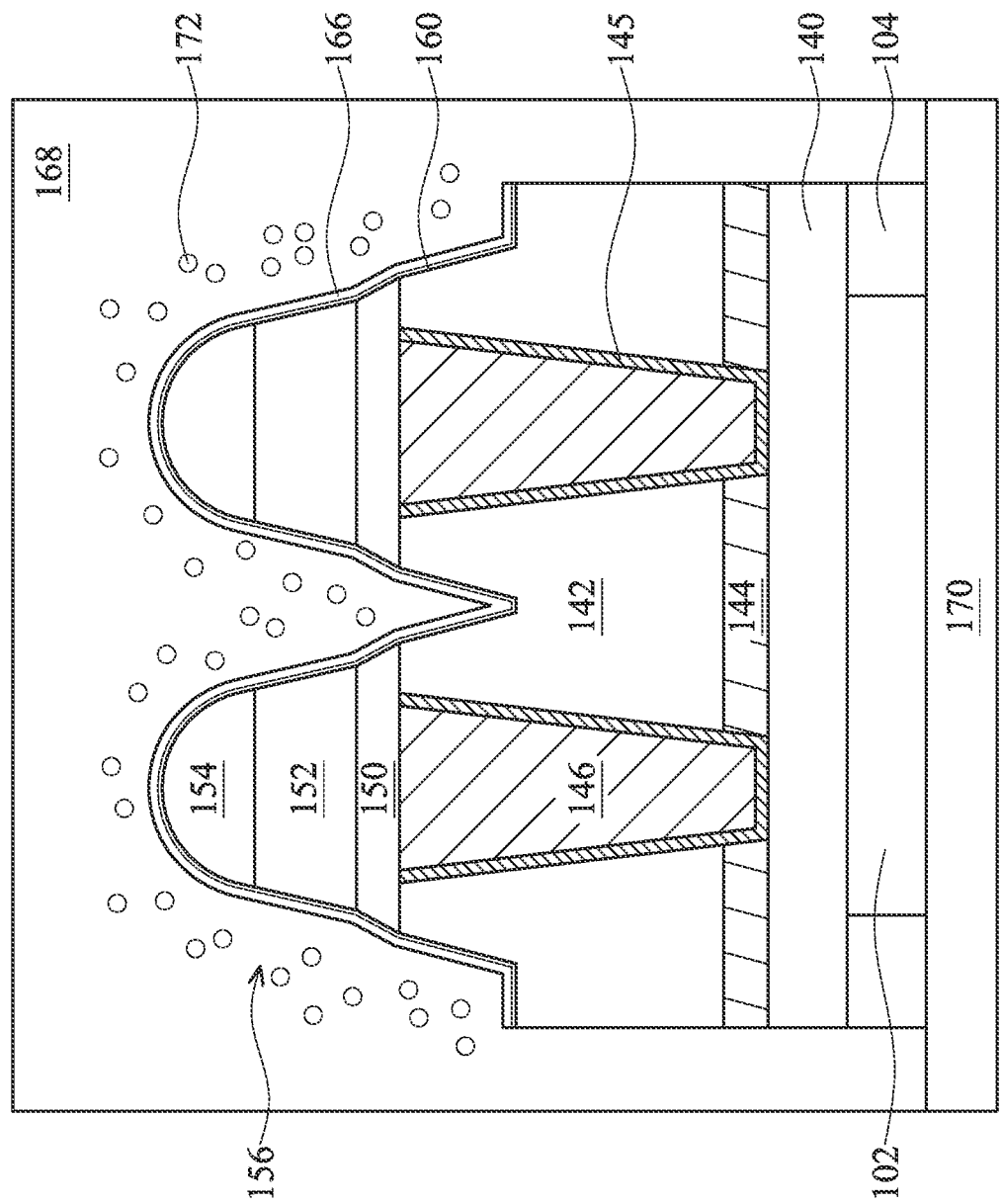

Next, the un-oxidized portion of the cap layer 164 is removed in a vacuum chamber 168 with a heating chuck 170, as shown in FIG. 3E in accordance with some embodiments. The un-oxidized portion of the cap layer 164 is removed by desorbing the metal element from the cap layer 164. Since there is a selection rule between the vapor pressure the metal element of the cap layer and the oxidized cap layer 166, the metal element 172 such as Mg may be degassed under the vapor pressure.

In some embodiments, the metal element 172 may be degassed under a vapor pressure in a range of about $10^{-8}$ torr to about $10^{-5}$ torr. The metal element 172 may be degassed under a temperature of about 450K to about 550K. The metal element 172 may be degassed for about 1 minute to about 60 minutes. If the pressure, the temperature, the duration is too great, the thermal budget may be limited. If the pressure, the temperature, the duration is too less, the metal element 172 in the un-oxidized portion of the cap layer 164 may not be degassed completely.

Figure 3F:
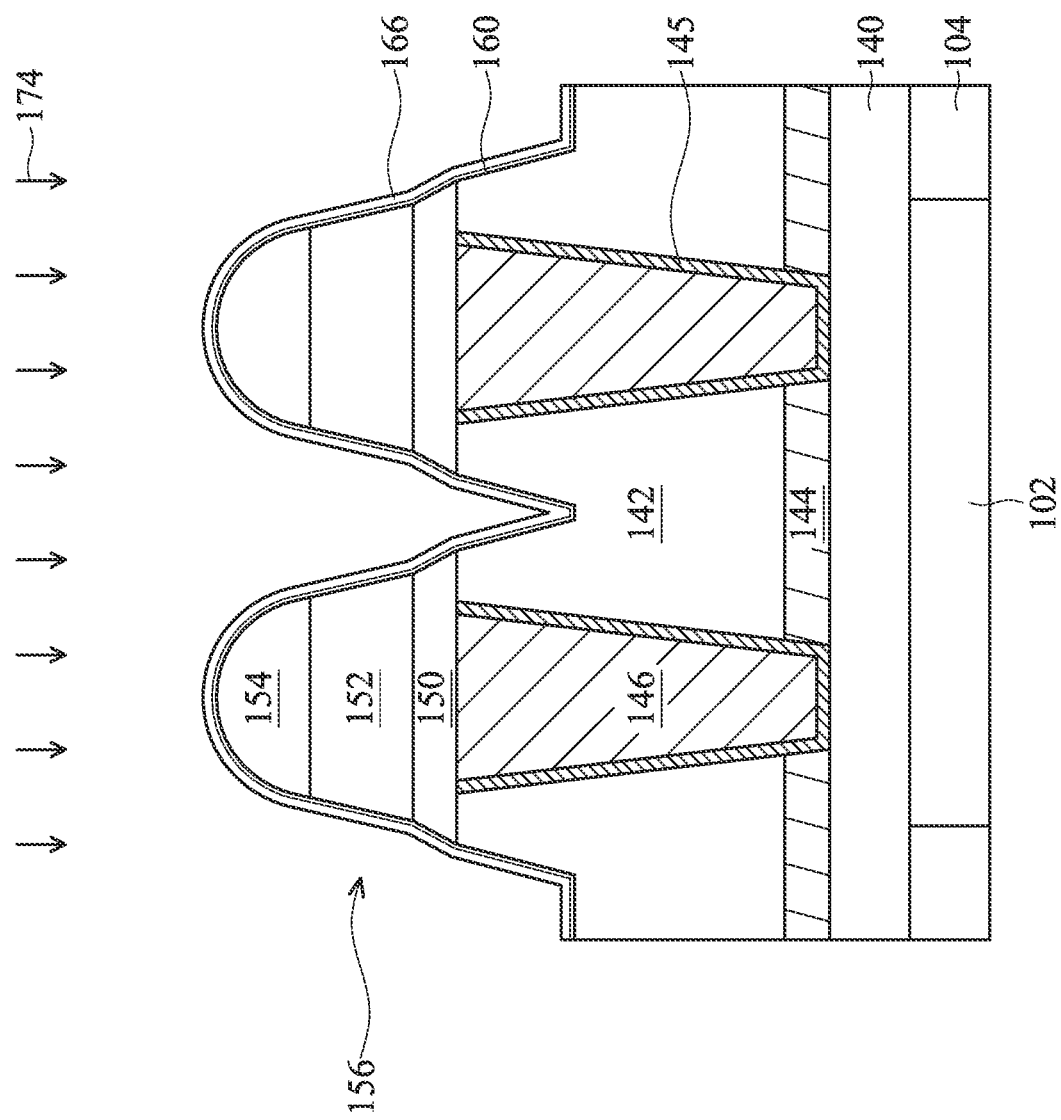
Figure 3G:
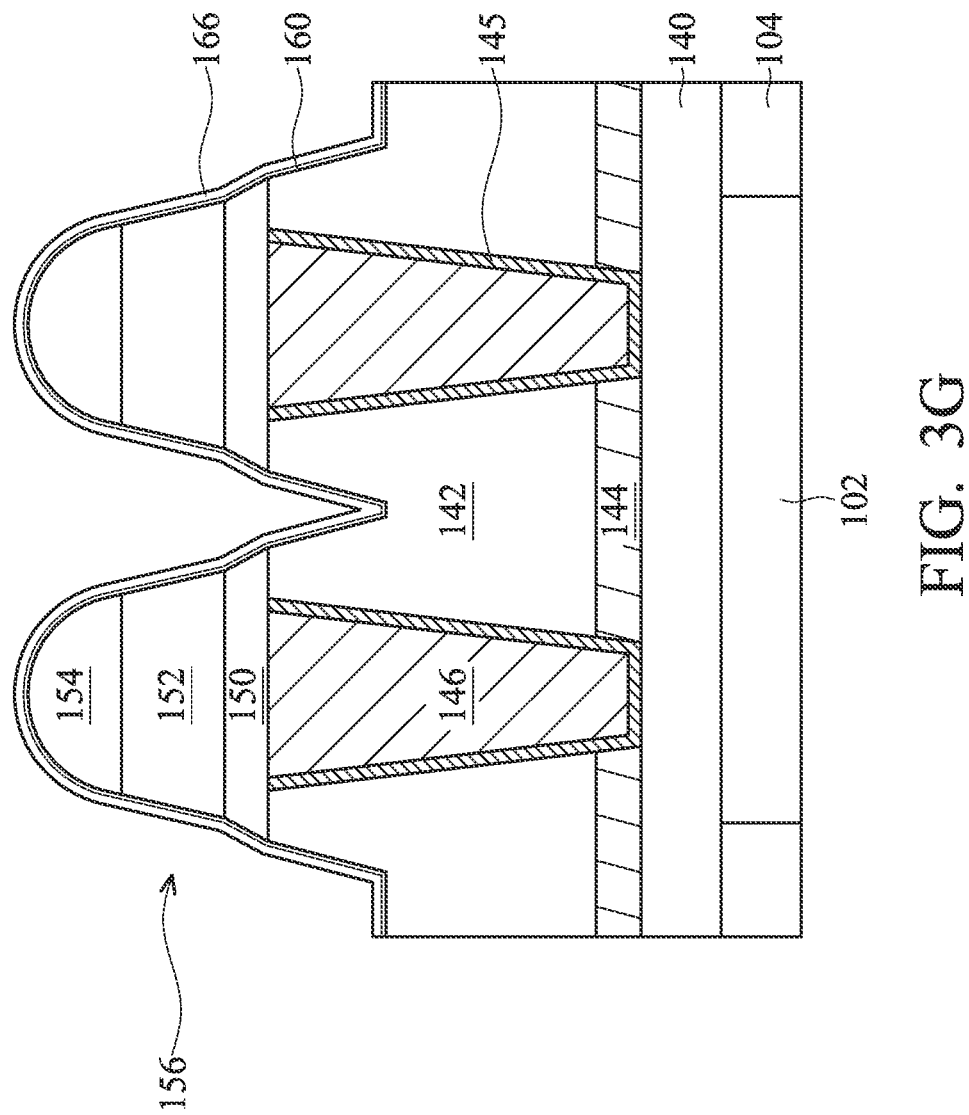

After the degassing the metal elements, the oxidized cap layer 166 remains over the oxidized metal layer 160. Afterwards, a thermal treatment 174 is performed, as shown in FIG. 3F, and the structure after performing the thermal treatment 174 is shown in FIG. 3G in accordance with some embodiments. The thermal treatment 174 may be a thermal process in BEOL process. The inert oxidized cap layer 166 may not diffuse in the MTJ stacks 152 during the thermal treatment 174. Therefore, the performance of the MTJ device 156 may not be degraded after the thermal treatment 174.

Figure 3H:
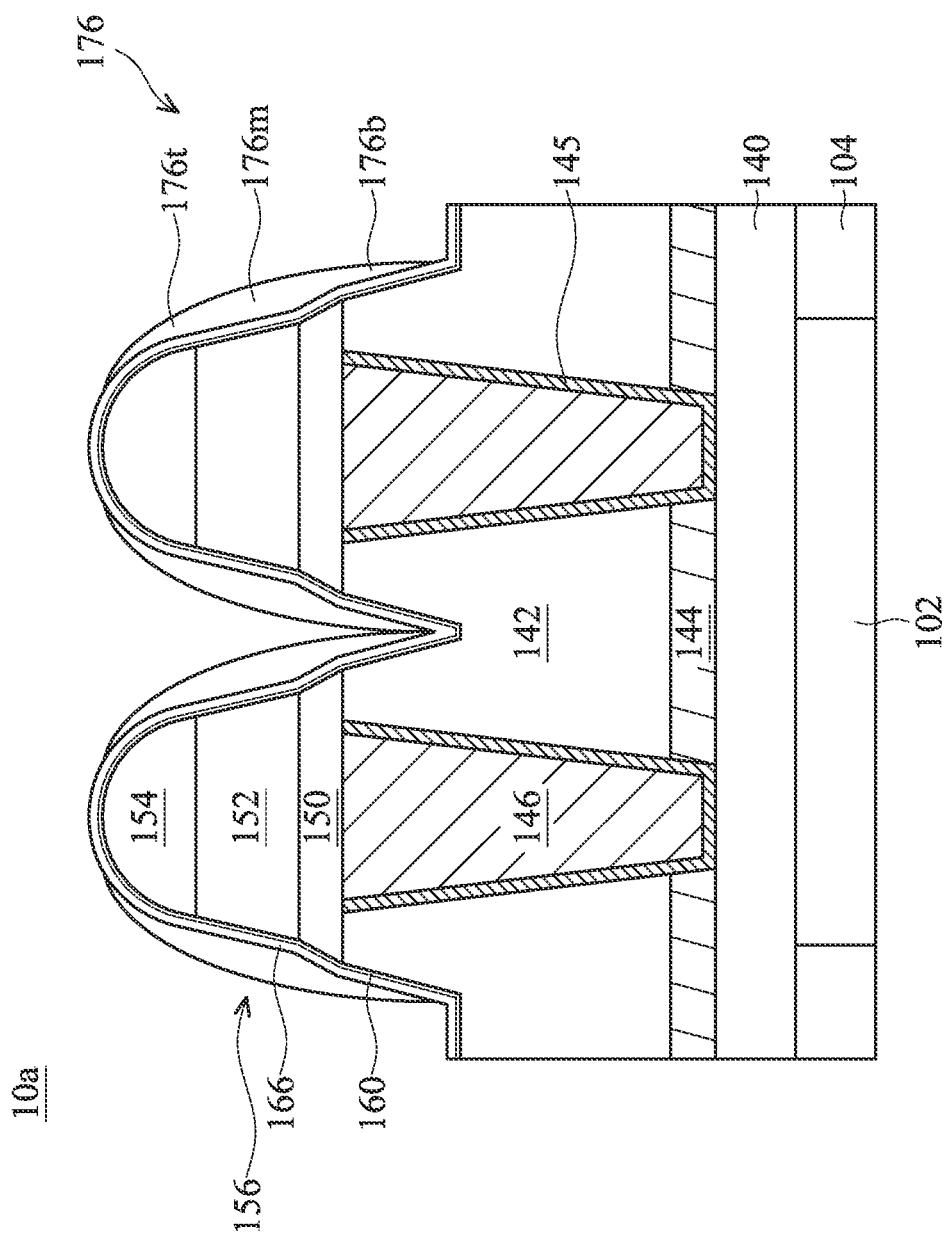

Next, spacers 176 are formed around the MTJ device 156, as shown in FIG. 3H in accordance with some embodiments. The spacers 176 may include one or more dielectric materials such as silicon oxide ($SiO_x$), silicon nitride ($SiN_x$), silicon oxynitride ($Si_xO_yN_z$), or the like. The spacers 176 may include one or multiple layers of the dielectric materials in various embodiments. In some embodiments, the spacers 176 have smooth sidewalls.

The spacers 176 may be formed by depositing a blanket dielectric layer covering the MTJ device 156 and the dielectric layer 142 using CVD, ALD, or any applicable methods. Afterwards, the blanket dielectric layer is anisotropically etched to form the spacers 176. In some embodiments, the top surface of the spacers 176 is lower than the top surface of the MTJ device 156.

The spacers 176 may include a top portion 176*t*, a middle portion 176*m*, and a bottom portion 176*b*. In some embodiments, the middle portion 176*m* of the spacers 176 is thicker than the top portion 176*t* of the spacers 176. In some embodiments, the middle portion 176*m* of the spacers 176 is thicker than the bottom portion 176*b* of the spacers 176.

Figure 3I:
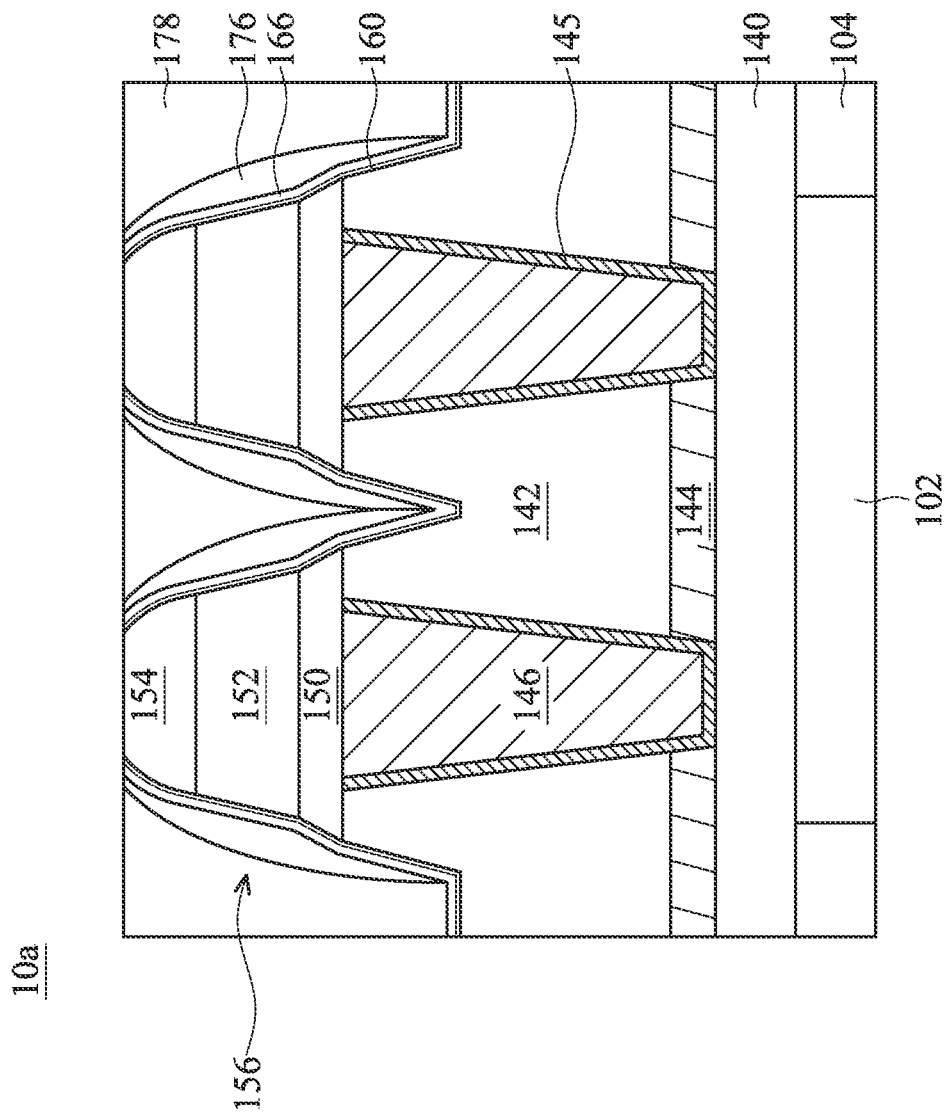

Next, a protection layer is conformally formed to cover the spacers 176, and a dielectric layer 178 is formed over the protection layer, as shown in FIG. 3I in accordance with some embodiments. The protection layer may be formed using ALD and then the dielectric layer 178 is formed using ALD. The protection layer may be made of a metal-based oxide, such as alumina ($Al_2O_3$). The dielectric layer 178 may be made of a dielectric material that is different from the material in the dielectric layer 142. For example, the dielectric layer 178 may include a nitride based dielectric material such as silicon carbonitride.

Next, a planarization process is performed to remove a top portion of the MTJ device 156, as shown in FIG. 3I in accordance with some embodiments. In some embodiments, a portion of the top electrode 154, the spacers 176, the protection layer, and the dielectric layer 178 are also slightly removed by the planarization process. The planarization process may be a CMP process, a mechanical grinding process, or the like. After the planarization process, the top surface of the MTJ device 156 is substantially level with the top surfaces of the spacers 176 and the dielectric layer 178.

In some embodiments, the MTJ device 156 are electrically connected to the device 102 shown in FIG. 2 by the interconnect structure 140 formed between the MTJ device 156 and the device 102.

By forming a metal cap layer 164 over the MTJ stack 152 after forming the oxidized metal layer 160, the excess oxygen residue may be absorbed by the cap layer 164 and an oxidized cap layer 166 may be formed. The un-oxidized portion of the cap layer 164 may be easy to be degassed in a vacuum chamber 168. The remaining oxidized cap layer 166 may provide insulation, and the performance of the MTJ stack 152 may remain after the BEOL thermal treatment 174.

Many variations and/or modifications may be made to the embodiments of the disclosure. FIGS. 4A-4D are cross-sectional representations of various stages of forming a semiconductor memory structure 10*b*, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 4A in accordance with some embodiments, the oxidized cap layer 166 has segments 166*a* and 166*l* with different widths.

Figure 4A:
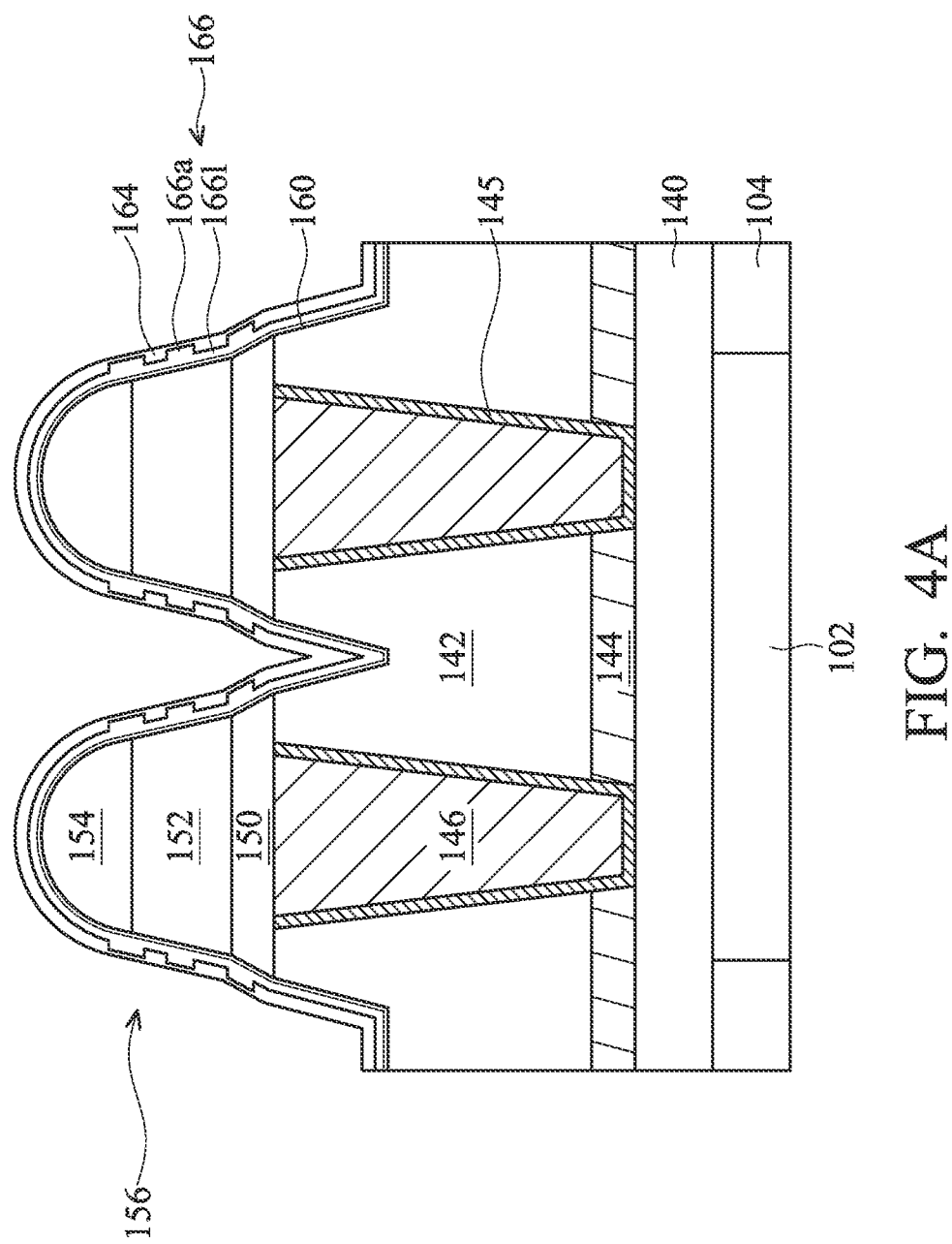
FIGS. 4A-4D are cross-sectional representations of various stages of forming a semiconductor memory structure, in accordance with some embodiments of the disclosure.

In some embodiments as shown in FIG. 4A, the oxidized cap layer 166 has thicker elements 166*a* and thinner elements 166*l*. In some embodiments, the thicker elements 166*a* are separated from each other.

In some embodiments, the metal layer 158 is discontinuous. The profile of the metal layer 158 may depend on the angle of the IBE etching process and the spacing between the MTJ device 156. In some embodiments, the excess oxygen is not uniform after the oxidation process 162. The position and thickness of the oxidized cap layer 166 may depend on the distribution of the excess oxygen.

Figure 4B:
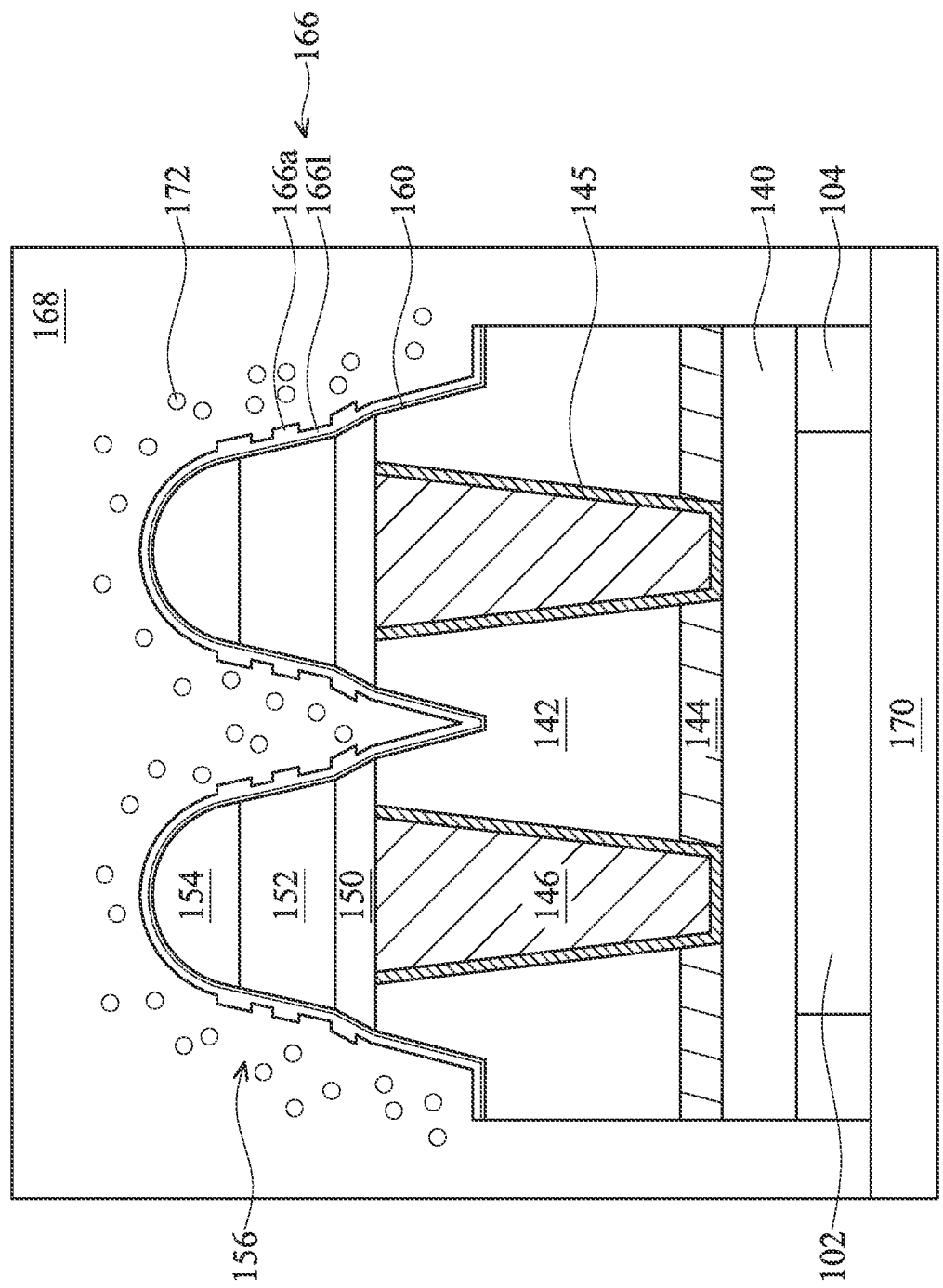
Figure 4C:
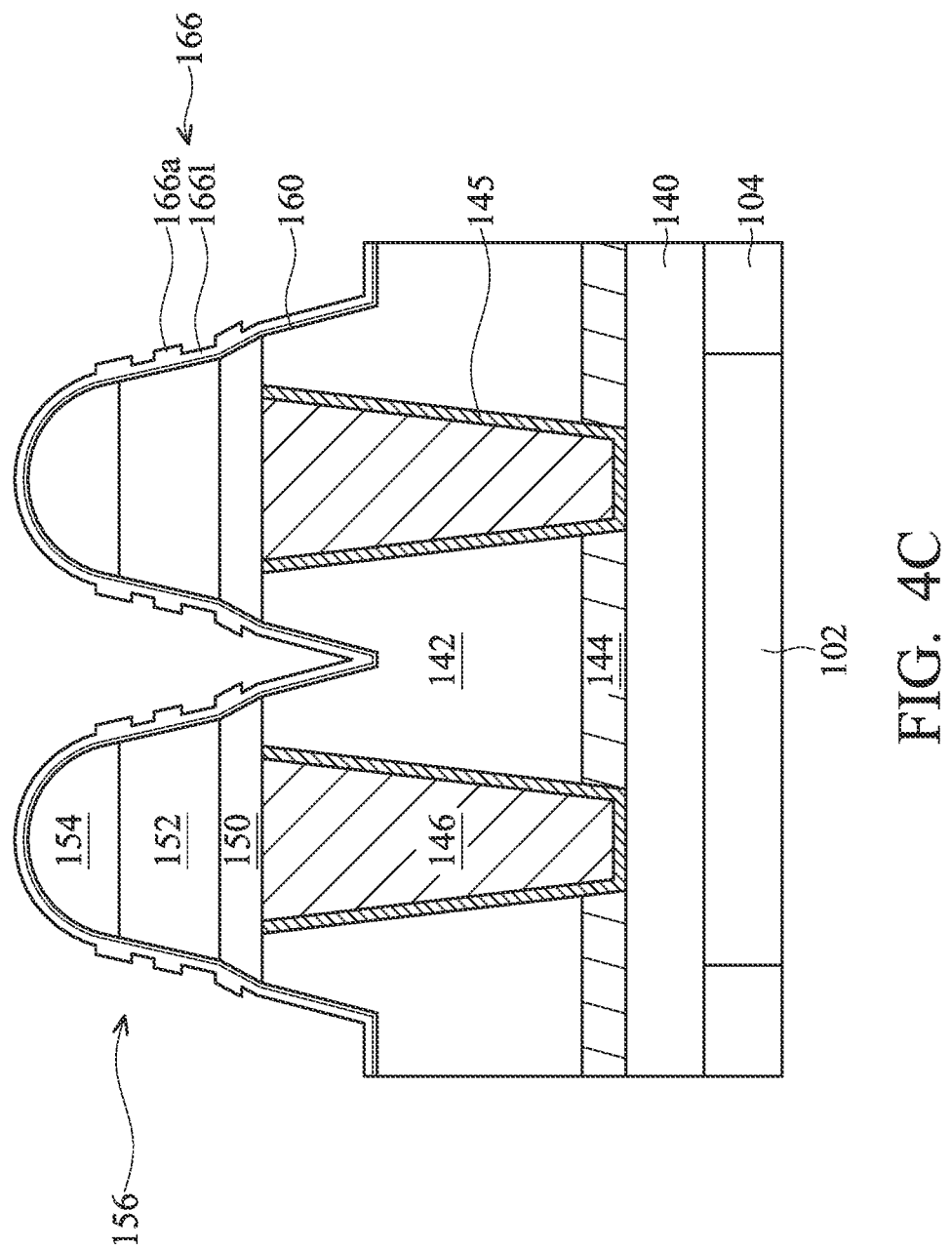

After forming the oxidized cap layer 166, the un-oxidized portion may be degassed, and only the oxidized cap layer 166 remains, as shown in FIGS. 4B and 4C in accordance with some embodiments. The processes for degassing the metal element 172 may be the same as, or similar to, those used to degassing the metal element 172 in the previous embodiments. For the purpose of brevity, the descriptions of these processes are not repeated herein.

Figure 4D:
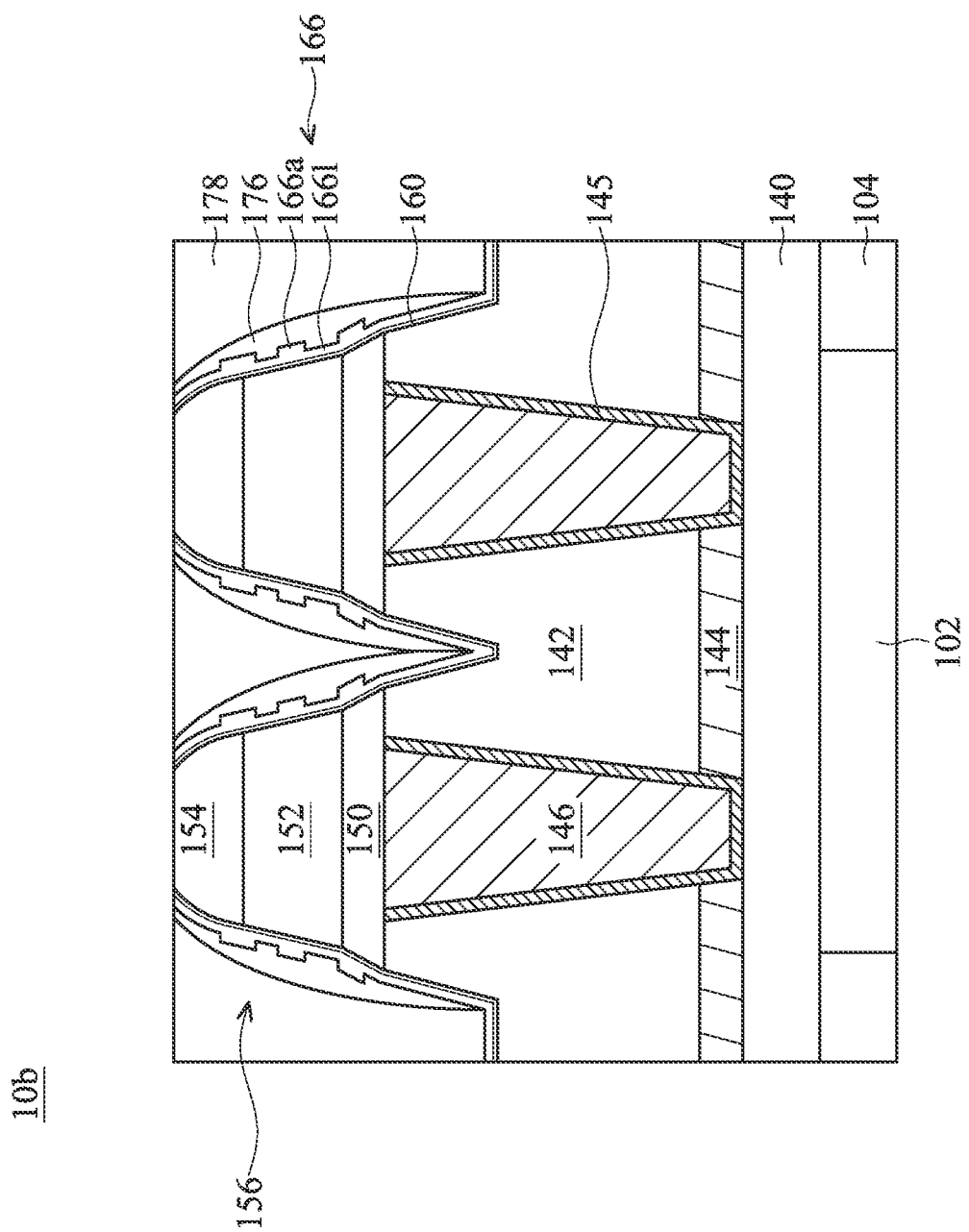

Next, spacers 176 are formed surrounding the MTJ devices 156, and the dielectric layer 178 are formed between the MTJ devices 156, as shown in FIG. 4D in accordance with some embodiments. The processes for forming the spacers 176 and the dielectric layer 178 may be the same as, or similar to, those used to form the spacers 176 and the dielectric layer 178 in the previous embodiments. For the purpose of brevity, the descriptions of these processes are not repeated herein.

In some embodiments, although the oxidized cap layer 166 with thicker elements 166*a* and thinner elements 166*l* has jagged sidewalls, the spacers 176 still has smooth sidewalls. In some embodiments, the spacers 176 have thicker portion beside the thinner elements 166*l* of the oxidized cap layer 166 and thinner portion beside the thicker elements 166*a* of the oxidized cap layer 166.

By forming a metal cap layer 164 over the MTJ stack 152 after forming the oxidized metal layer 160, the excess oxygen residue may be absorbed by the cap layer 164 and an oxidized cap layer 166 may be formed. The un-oxidized portion of the cap layer 164 may be easy to be degassed in a vacuum chamber 168. The remaining oxidized cap layer 166 may provide insulation, and the performance of the MTJ stack 152 may remain after the BEOL thermal treatment 174. The oxidized cap layer 166 may have thicker elements 166*a* and 166*l* separated from each other.

Many variations and/or modifications may be made to the embodiments of the disclosure. FIGS. 5A-5D are cross-sectional representations of various stages of forming a semiconductor memory structure 10*c*, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 5A in accordance with some embodiments, the oxidized cap layer 166 has a thicker lower portion 166*l* and a thinner upper portion 166*u*.

During the oxidation process 162, there may be more oxygen at the bottom between the MTJ device 156. There may be more excess oxygen at the bottom between the MTJ device 156. Therefore, the oxidized cap layer 166 may have a smooth sidewall and the lower portion 166*l* may be thicker than the upper portion 166*u*.

The thickness of the oxidized cap layer 166 may be related to the distribution of excess residual oxygen in the oxidation process 162, which is correspond to the influence of the metal layer 158 redeposited position on the sidewall of the MTJ device 156. If residual oxygen may exist at the position lacking of the metal layer 158, and the subsequently formed oxidized cap layer 166 may be thicker.

Figure 5A:
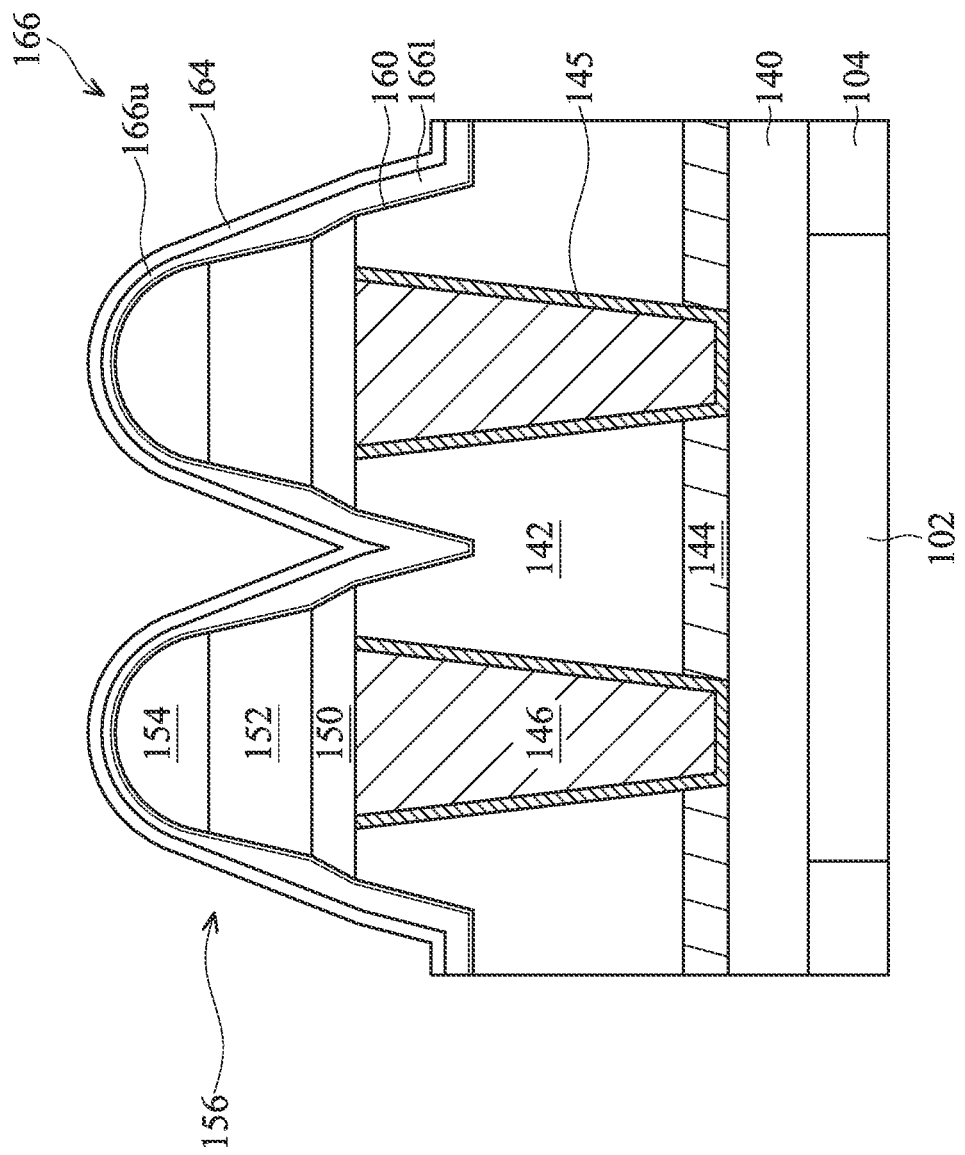
FIGS. 5A-5D are cross-sectional representations of various stages of forming a semiconductor memory structure, in accordance with some embodiments of the disclosure.
Figure 5B:
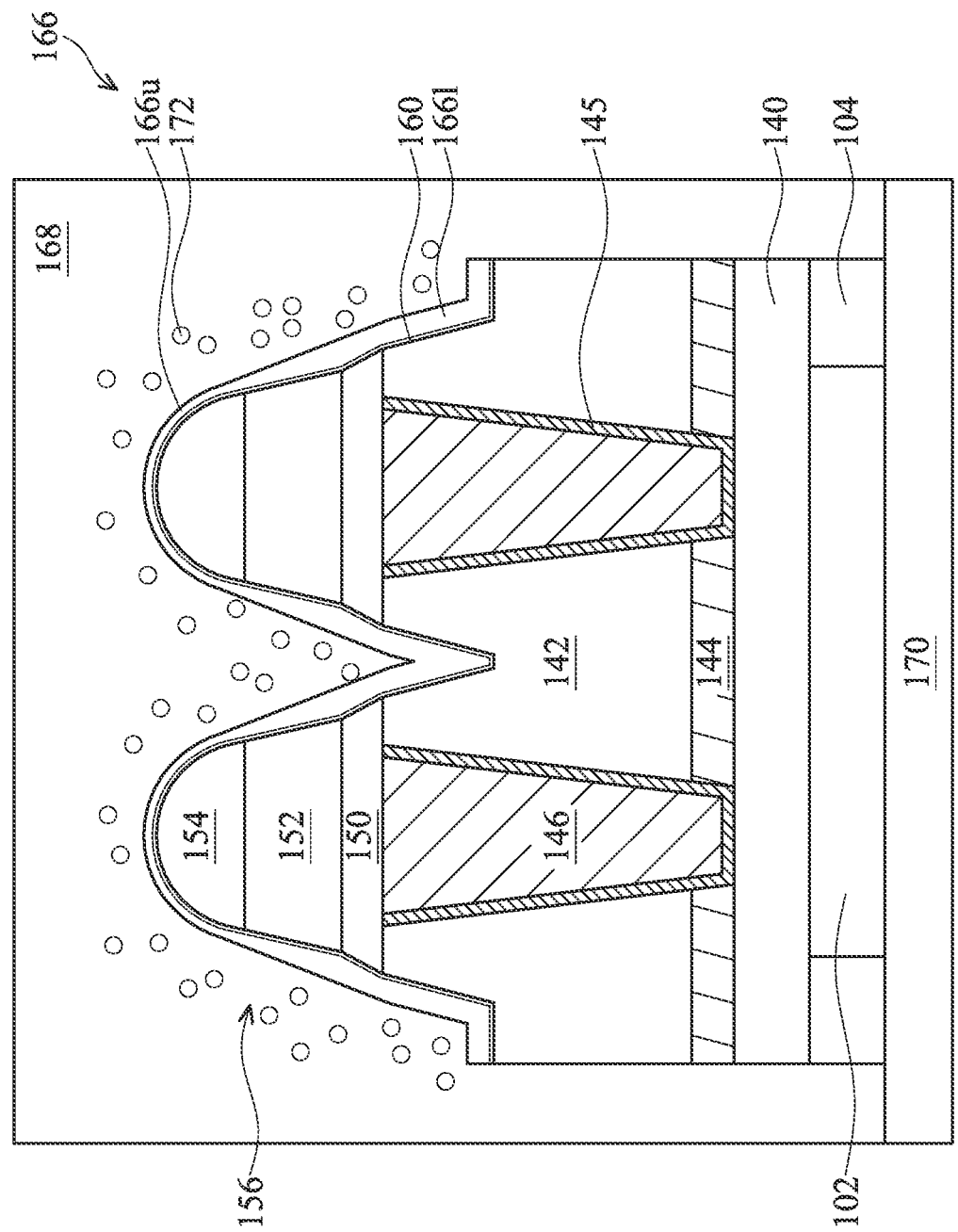
Figure 5C:
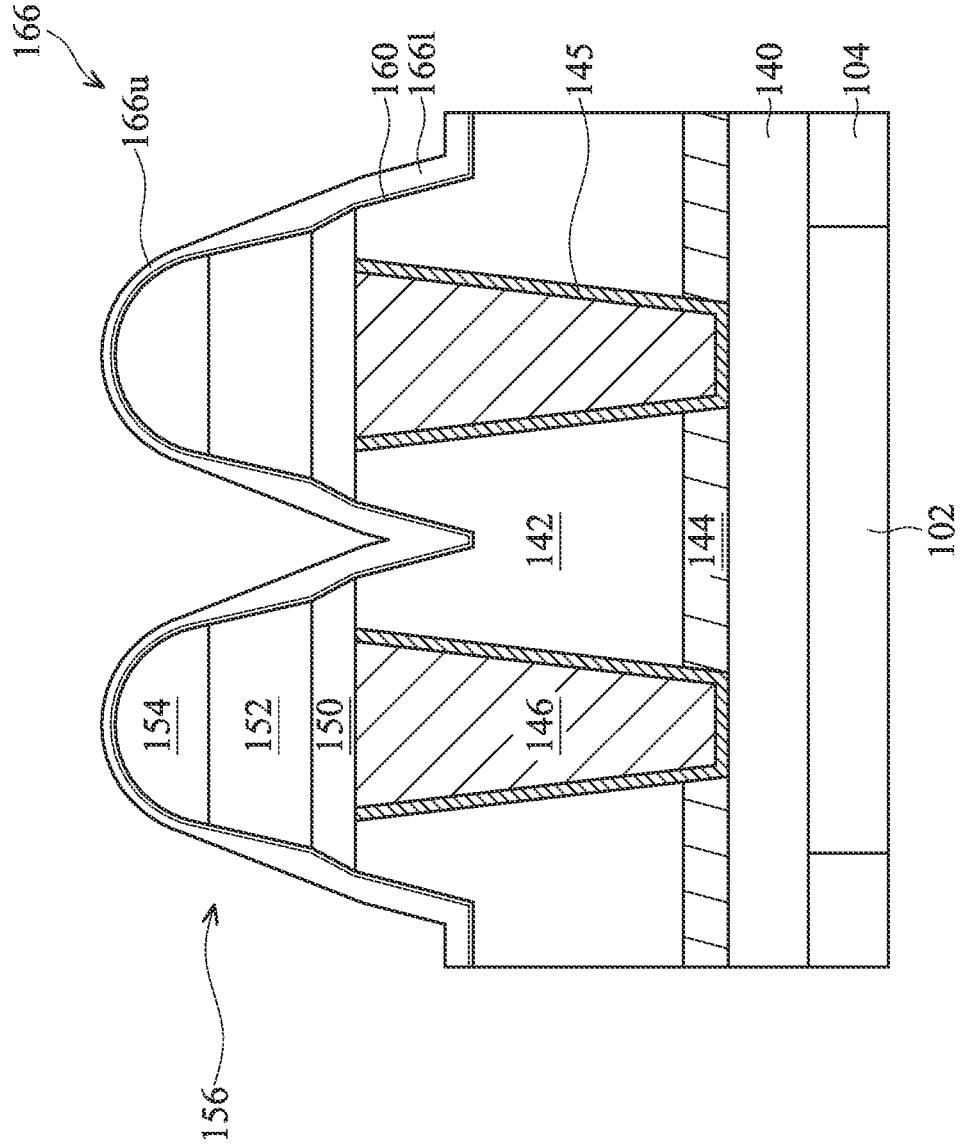

After forming the oxidized cap layer 166, the un-oxidized portion may be degassed, and only the oxidized cap layer 166 remains, as shown in FIGS. 5B and 5C in accordance with some embodiments. The processes for degassing the metal element 172 may be the same as, or similar to, those used to degassing the metal element 172 in the previous embodiments. For the purpose of brevity, the descriptions of these processes are not repeated herein.

Figure 5D:
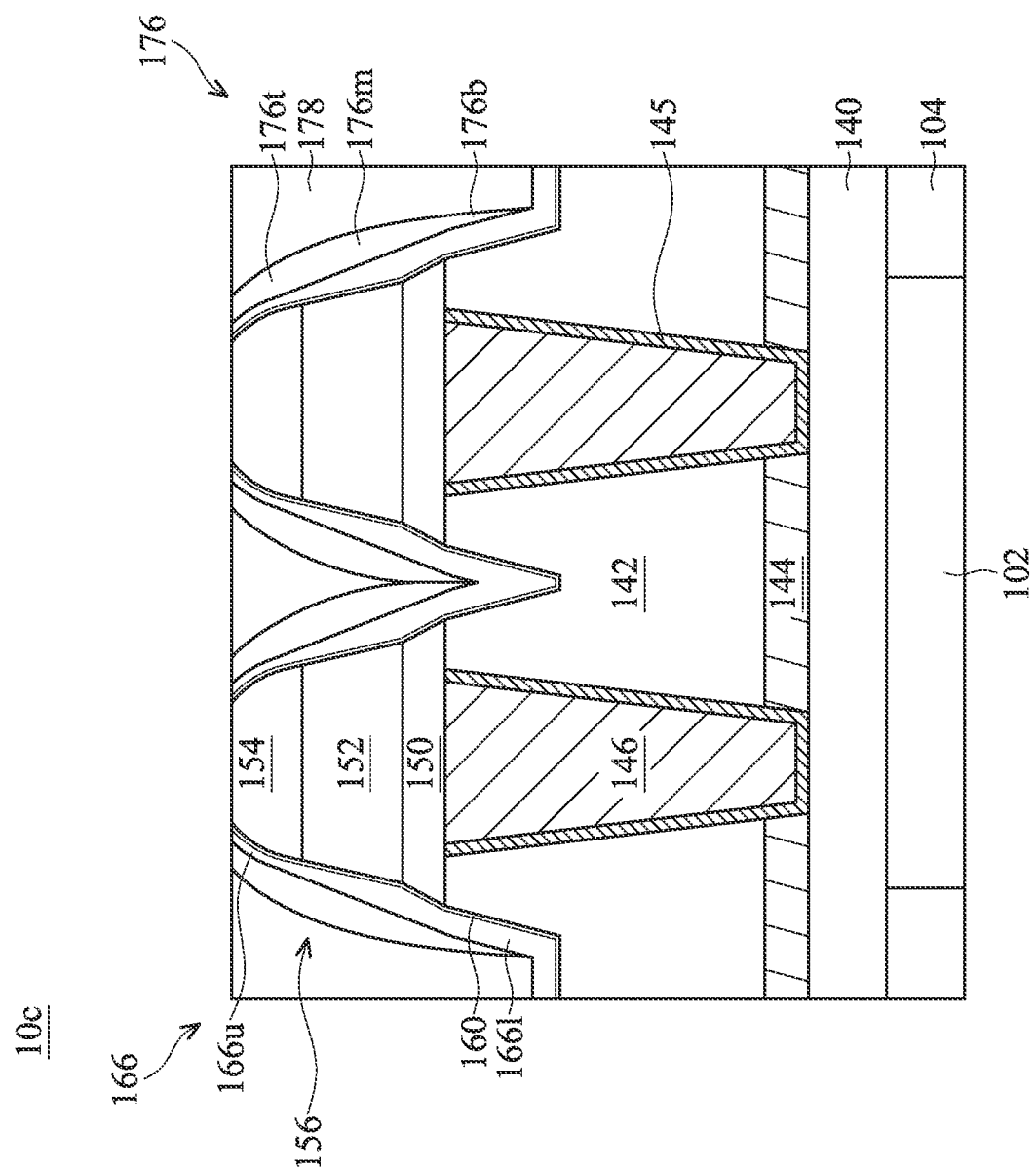

Next, spacers 176 are formed surrounding the MTJ devices 156, and the dielectric layer 178 are formed between the MTJ devices 156, as shown in FIG. 5D in accordance with some embodiments. The processes for forming the spacers 176 and the dielectric layer 178 may be the same as, or similar to, those used to form the spacers 176 and the dielectric layer 178 in the previous embodiments. For the purpose of brevity, the descriptions of these processes are not repeated herein.

In some embodiments, the spacers 176 have smooth sidewalls. In some embodiments, the middle portion 176m of the spacers 176 is thicker than the top portion 176t of the spacers 176. In some embodiments, the top portion 176t of the spacers 176 is thicker than the bottom portion 176b of the spacers 176.

By forming a metal cap layer 164 over the MTJ stack 152 after forming the oxidized metal layer 160, the excess oxygen residue may be absorbed by the cap layer 164 and an oxidized cap layer 166 may be formed. The un-oxidized portion of the cap layer 164 may be easy to be degassed in a vacuum chamber 168. The remaining oxidized cap layer 166 may provide insulation, and the performance of the MTJ stack 152 may remain after the BEOL thermal treatment 174. The lower portion 166l of the oxidized cap layer 166 may be thicker.

Many variations and/or modifications may be made to the embodiments of the disclosure. FIGS. 6A-6D are cross-sectional representations of various stages of forming a semiconductor memory structure 10d, in accordance with some embodiments of the disclosure. Some processes or devices are the same as, or similar to, those described in the embodiments above, and therefore the descriptions of these processes and devices are not repeated herein. The difference from the embodiments described above is that, as shown in FIG. 6A in accordance with some embodiments, the oxidized cap layer 166 has a thicker middle portion 166m and thinner top portion 166u and lower portion 166l.

The IBE etching may cause the metal layer 158 redepositing over the MRAM cells 156, and the redeposited metal layer 158 over the sidewall of the MTJ stacks 152 may be thicker. The IBE etching may include inert gas bombardment. After elastic or inelastic collisions, the desorption angle of metal atoms is related to the angle of IBE etching bombardment, so the metal layer 158 redeposited may on the sidewalls of the MTJ stack 152 may have various distribution. After the oxidation process 162 and the capping layer 164 reacting with the excess oxygen, the oxidized cap layer 166 may have a smooth sidewall and the middle portion 166m besides the sidewall of the MTJ stacks 152 may be the thickest.

Figure 6A:
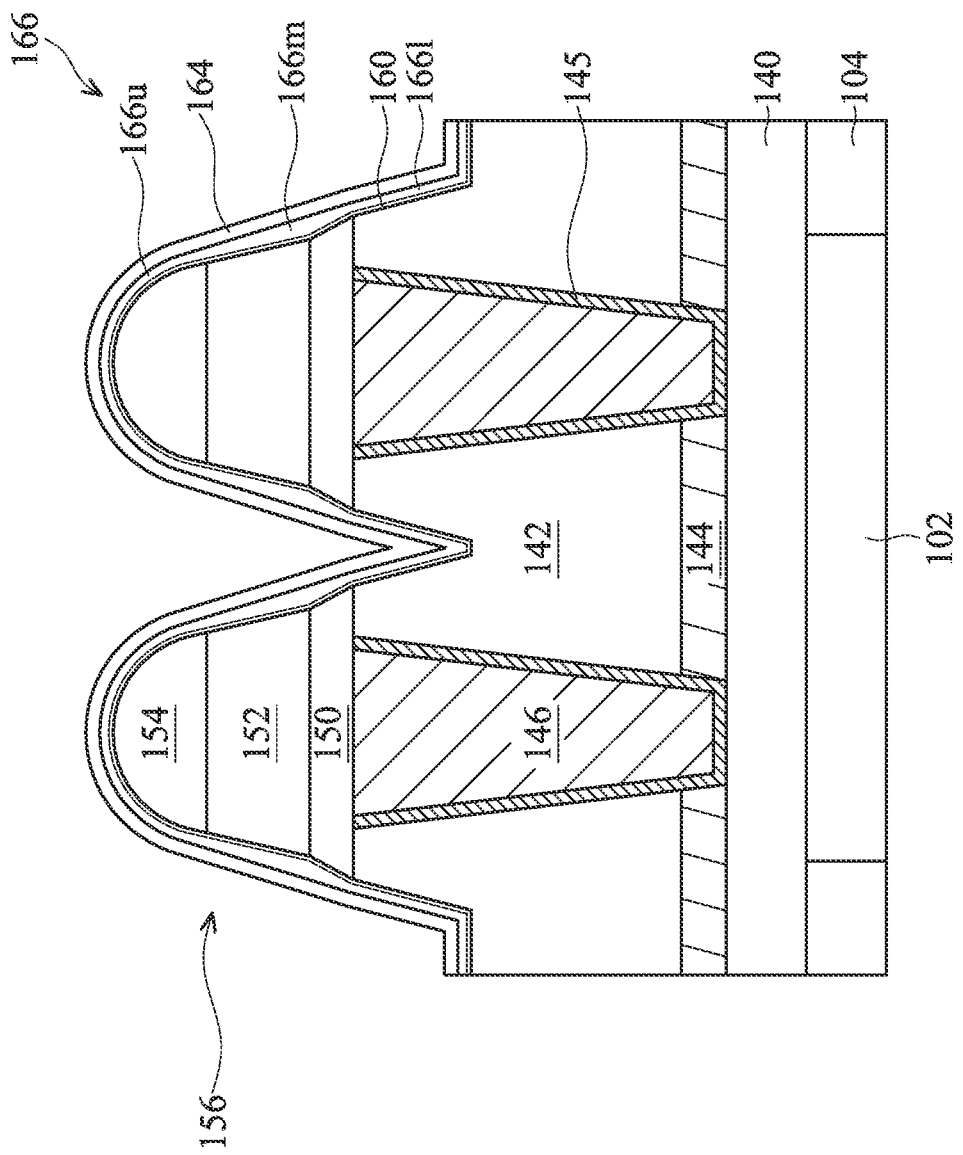
FIGS. 6A-6D are cross-sectional representations of various stages of forming a semiconductor memory structure, in accordance with some embodiments of the disclosure.
Figure 6B:
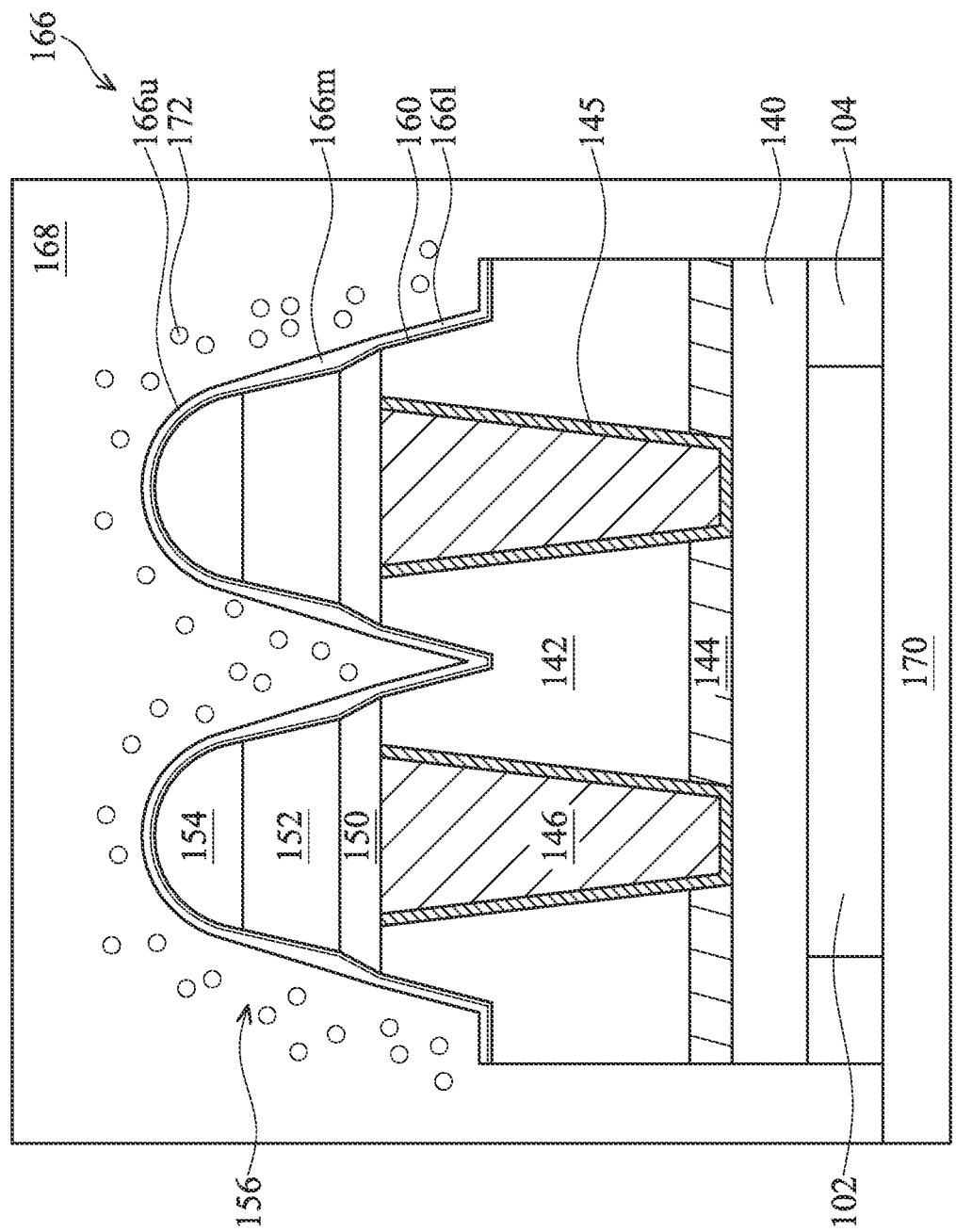
Figure 6C:
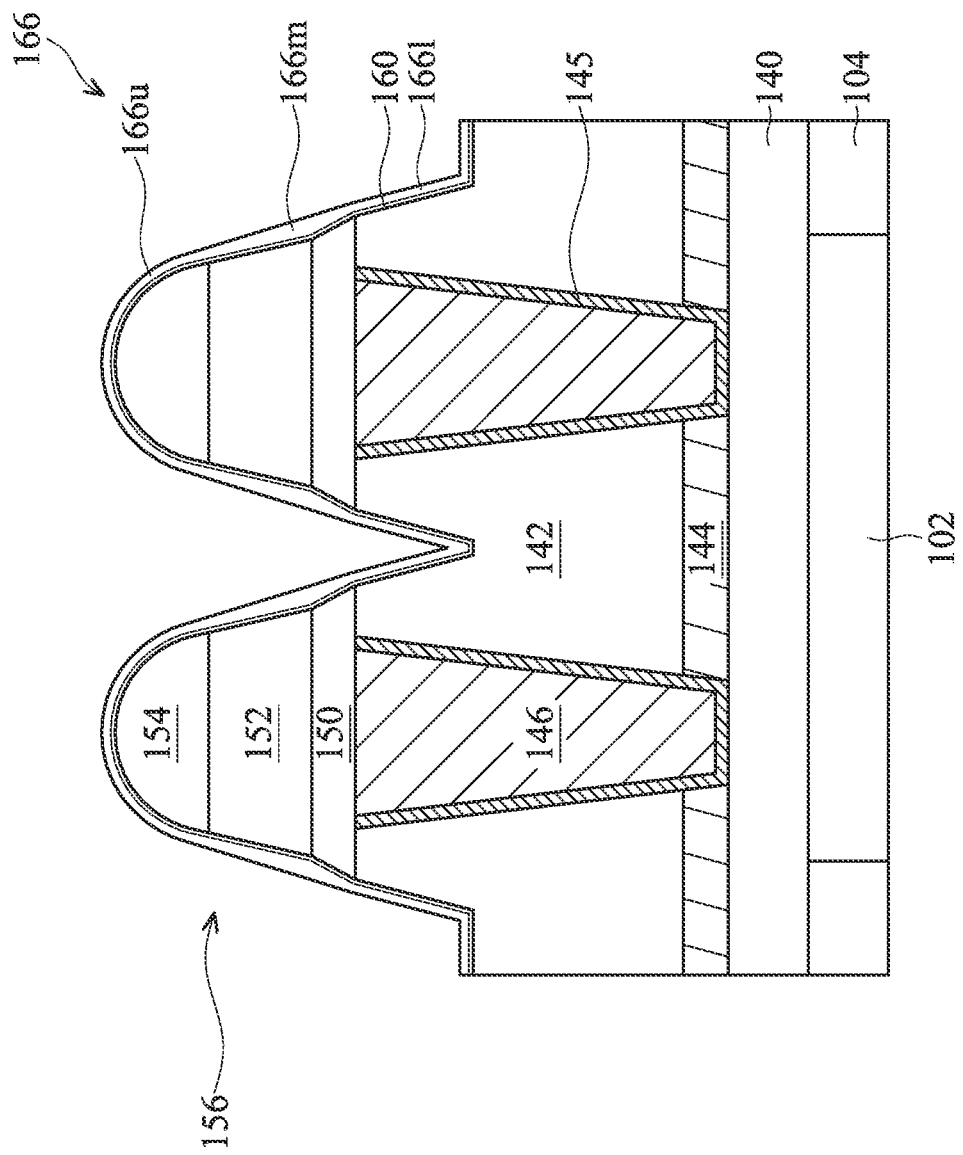

After forming the oxidized cap layer 166, the un-oxidized portion may be degassed, and only the oxidized cap layer 166 remains, as shown in FIGS. 6B and 6C in accordance with some embodiments. The processes for degassing the metal element 172 may be the same as, or similar to, those used to degassing the metal element 172 in the previous embodiments. For the purpose of brevity, the descriptions of these processes are not repeated herein.

Figure 6D:
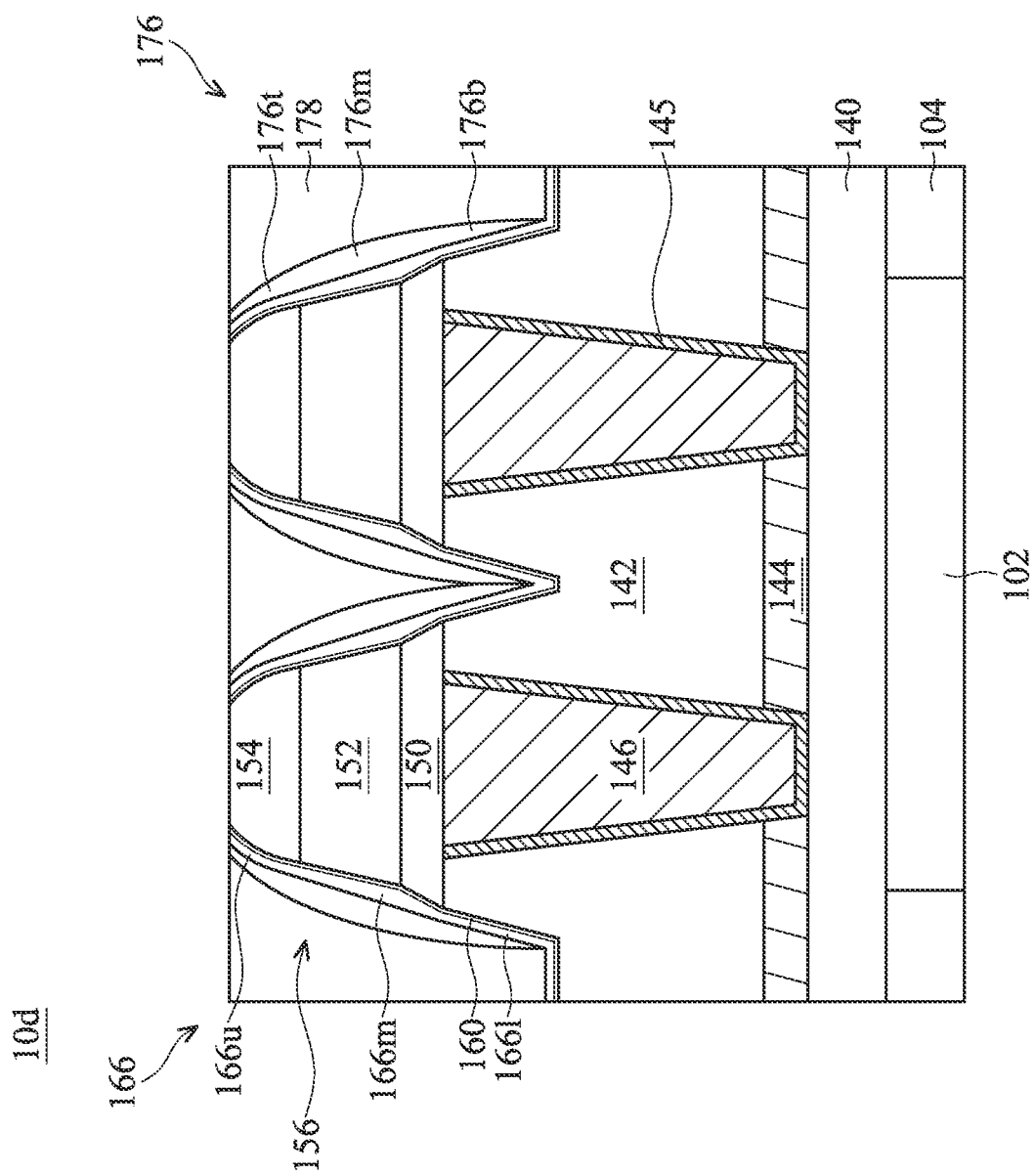

Next, spacers 176 are formed surrounding the MTJ devices 156, and the dielectric layer 178 are formed between the MTJ devices 156, as shown in FIG. 6D in accordance with some embodiments. The processes for forming the spacers 176 and the dielectric layer 178 may be the same as, or similar to, those used to form the spacers 176 and the dielectric layer 178 in the previous embodiments. For the purpose of brevity, the descriptions of these processes are not repeated herein.

In some embodiments, the spacers 176 have smooth sidewalls. In some embodiments, the middle portion 176m of the spacers 176 is thicker than the top portion 176t of the spacers 176. In some embodiments, the middle portion 176m of the spacers 176 is thicker than the bottom portion 176b of the spacers 176. By forming a metal cap layer 164 over the MTJ stack 152 after forming the oxidized metal layer 160, the excess oxygen residue may be absorbed by the cap layer 164 and an oxidized cap layer 166 may be formed. The un-oxidized portion of the cap layer 164 may be easy to be degassed in a vacuum chamber 168. The remaining oxidized cap layer 166 may provide insulation, and the performance of the MTJ stack 152 may remain after the BEOL thermal treatment 174. The middle portion 166m of the oxidized cap layer 166 besides the sidewall of the MTJ stacks 152 may be thicker.

As described previously, a metal cap layer 164 is formed to absorb the excess oxygen produced in the oxidation process 162 for passivating the metal layer 158. After absorbing the excess oxygen, an oxidized cap layer 166 is formed. An un-oxidized cap layer 164 may be degassed in a vacuum chamber 168, and the oxidized cap layer 166 remains over the MTJ stacks 152 to provide passivation. In some embodiments as shown in FIG. 4C, the oxidized cap layer 166 has thicker and thinner elements 166 separated from each other. In some embodiments as shown in FIG. 5C, the oxidized cap layer 166 has a wider lower portion 166l and a thinner top portion 166u. In some embodiments as shown in FIG. 6C, the oxidized cap layer 166 has a widest portion 166m near the sidewall of the MTJ stack 152.

Embodiments of a semiconductor memory structure and a method for forming the same are provided. A metal cap layer such as a magnesium cap layer is deposited over the oxide metal layer over the MTJ device. The metal cap layer may absorb the excess oxygen produced when forming the oxide metal layer. Therefore, an oxidized cap layer with ceramic insulation properties may be formed. The un-oxidized cap layer may be removed by degassing the metal element in a vacuum chamber. The MTJ performance may remain with the oxidized cap layer insulation.

In some embodiments, a method for forming a semiconductor memory structure is provided. The method for forming a semiconductor memory structure includes forming an MTJ stack over a substrate. The method for forming a semiconductor memory structure also includes etching the MTJ stack to form an MTJ device. The method for forming a semiconductor memory structure also includes depositing a metal layer over a top surface and sidewalls of the MTJ device. The method for forming a semiconductor memory structure also includes oxidizing the metal layer to form an oxidized metal layer. The method for forming a semiconductor memory structure also includes depositing a cap layer over the oxidized metal layer. The method for forming a semiconductor memory structure also includes oxidizing the cap layer to form an oxidized cap layer. The method for forming a semiconductor memory structure also includes removing an un-oxidized portion of the cap layer.

In some embodiments, a method for forming a semiconductor memory structure is provided. The method for forming a semiconductor memory structure includes forming a bottom electrode layer over a substrate. The method for forming a semiconductor memory structure also includes forming an MTJ stack over the bottom electrode layer. The method for forming a semiconductor memory structure also includes forming a top electrode layer over the MTJ stack. The method for forming a semiconductor memory structure also includes etching the bottom electrode layer, the MTJ stack, and the top electrode layer to form an MTJ device. The method for forming a semiconductor memory structure also includes depositing a metal layer over sidewalls of the MTJ device. The method for forming a semiconductor memory structure also includes oxidizing the metal layer. The method for forming a semiconductor memory structure also includes depositing a magnesium cap layer and forming an oxidized magnesium cap layer over the metal layer. The method for forming a semiconductor memory structure also includes degassing Mg from the oxidized magnesium cap layer.

In some embodiments, a semiconductor memory structure is provided. The semiconductor memory structure includes a bottom electrode formed over a substrate. The semiconductor memory structure also includes an MTJ stack formed over the bottom electrode. The semiconductor memory structure also includes a top electrode formed over the MTJ stack. The semiconductor memory structure also includes a metal oxide layer formed over sidewalls of the MTJ stack. The semiconductor memory structure also includes a magnesium oxide layer formed over the metal oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor memory structure, the method comprising:
   forming a magnetic tunneling junction (MTJ) stack over a substrate;
   etching the MTJ stack to form an MTJ device;
   depositing a metal layer over a top surface and sidewalls of the MTJ device;
   oxidizing the metal layer to form an oxidized metal layer;
   depositing a cap layer over the oxidized metal layer;
   oxidizing the cap layer to form an oxidized cap layer; and
   removing an un-oxidized portion of the cap layer.

2. The method for forming a semiconductor memory structure as claimed in claim 1, wherein the cap layer comprises Mg.

3. The method for forming a semiconductor memory structure as claimed in claim 1, wherein the un-oxidized portion of the cap layer is removed by desorbing a metal element from the cap layer.

4. The method for forming a semiconductor memory structure as claimed in claim 1, wherein the metal layer has a thickness in a range of 1 nm to 5 nm.

5. The method for forming a semiconductor memory structure as claimed in claim 1, wherein etching the MTJ stack comprises ion beam etching (IBE).

6. The method for forming a semiconductor memory structure as claimed in claim 1, wherein the cap layer is in-situ deposited when etching the MTJ stack.

7. The method for forming a semiconductor memory structure as claimed in claim 1, wherein the oxidized metal layer is formed over sidewalls of the MTJ device.

8. A method for forming a semiconductor memory structure, the method comprising:
   forming a bottom electrode layer over a substrate;
   forming a magnetic tunneling junction (MTJ) stack over the bottom electrode layer;
   forming a top electrode layer over the MTJ stack;
   etching the bottom electrode layer, the MTJ stack, and the top electrode layer to form an MTJ device;
   depositing a metal layer over sidewalls of the MTJ device;
   oxidizing the metal layer;
   depositing a magnesium cap layer and forming an oxidized magnesium cap layer over the metal layer; and
   degassing Mg from the oxidized magnesium cap layer.

9. The method for forming a semiconductor memory structure as claimed in claim 8, further comprising:
   thermal treating the MTJ device after degassing Mg from the oxidized magnesium cap layer.

10. The method for forming a semiconductor memory structure as claimed in claim 8, wherein excess oxygen is produced after oxidizing the metal layer.

11. The method for forming a semiconductor memory structure as claimed in claim 10, wherein the excess oxygen covers a portion of the sidewalls of the MTJ device.

12. The method for forming a semiconductor memory structure as claimed in claim 10, wherein Mg in the magnesium cap layer reacts with the excess oxygen to form the oxidized magnesium cap layer.

13. The method for forming a semiconductor memory structure as claimed in claim 8, wherein Mg is degassed under a pressure in a range of $10^{-8}$ torr to $10^{-5}$ torr.

14. A method for forming a semiconductor memory structure, the method comprising:
   forming a magnetic tunneling junction (MTJ) device over a substrate;
   forming a first oxidized metal layer over sidewalls of the MTJ device;
   depositing a metal layer over the first oxidized metal layer, wherein the metal layer comprises a first portion near the first oxidized metal layer and a second portion located further away from the first oxidized metal layer;
   converting the first portion of the metal layer into a second oxidized metal layer;
   removing the second portion of the metal layer; and
   forming spacers around the MTJ device.

15. The method for forming a semiconductor memory structure as claimed in claim 14, wherein the second oxidized metal layer comprises thicker elements and thinner elements, and the thicker elements are separated from each other.

16. The method for forming a semiconductor memory structure as claimed in claim 15, wherein the thicker elements and thinner elements form jagged sidewalls, and an outermost sidewall of the spacers is smooth.

17. The method for forming a semiconductor memory structure as claimed in claim 14, wherein the second oxidized metal layer comprises MgO, and the first oxidized metal layer comprises Fe, Co, or a combination thereof.

18. The method for forming a semiconductor memory structure as claimed in claim 14, wherein the second oxidized metal layer is in direct contact with the first oxidized metal layer.

19. The method for forming a semiconductor memory structure as claimed in claim 14, wherein a lower portion of the second oxidized layer is thicker than an upper portion of the second oxidized layer.

20. The method for forming a semiconductor memory structure as claimed in claim 19, wherein a middle portion of the spacers is thicker than a top portion of the spacers, and the top portion of the spacers is thicker than a bottom portion of the spacers.

* * * * *